US007328195B2

(12) United States Patent
Willis

(10) Patent No.: US 7,328,195 B2
(45) Date of Patent: Feb. 5, 2008

(54) SEMI-AUTOMATIC GENERATION OF BEHAVIOR MODELS CONTINUOUS VALUE USING ITERATIVE PROBING OF A DEVICE OR EXISTING COMPONENT MODEL

(75) Inventor: John Christopher Willis, Rochester, MN (US)

(73) Assignee: FTL Systems, Inc., Rochester, MN (US)

( * ) Notice: Subject to any disclaimer, the term of this patent is extended or adjusted under 35 U.S.C. 154(b) by 146 days.

(21) Appl. No.: 10/301,173

(22) Filed: Nov. 20, 2002

(65) Prior Publication Data

US 2003/0154061 A1 Aug. 14, 2003

Related U.S. Application Data

(60) Provisional application No. 60/331,887, filed on Nov. 21, 2001.

(51) Int. Cl.
  *G06N 5/00* (2006.01)
(52) U.S. Cl. .............................. 706/14; 706/13; 706/14; 364/489
(58) Field of Classification Search .................. 706/14, 706/13; 703/13, 14; 716/4, 6; 364/489
  See application file for complete search history.

(56) References Cited

U.S. PATENT DOCUMENTS

| 4,306,286 A | 12/1981 | Cocke et al. |
| 4,677,587 A | 6/1987 | Zemany, Jr. |
| 4,815,024 A | 3/1989 | Lewis |
| 4,827,427 A | 5/1989 | Hyduke |
| 4,835,726 A | 5/1989 | Lewis |
| 4,868,770 A | 9/1989 | Smith et al. |

(Continued)

FOREIGN PATENT DOCUMENTS

WO    WO 00/77692 A1    12/2000

OTHER PUBLICATIONS

Mock, Markus, Chambers, Craig, Eggers, Susan, Calpa: A Tool for Automating Selective Dynamic Compilation, 2000 *IEEE*, No. XP-001004227.

(Continued)

*Primary Examiner*—Wilbert L Starks, Jr.
(74) *Attorney, Agent, or Firm*—Oppenheimer Wolff & Donnelly LLP

(57) ABSTRACT

A method is taught for increasing the steady-state verification speed of analog and mixed signal design through increased simulation speed, model abstraction by probing an existing component model or actual device and formal comparison of distinct component models.

The innovative method taught here incrementally generates processor instructions optimized for operating the analog solver around a specific set of values (the operating context), caches sequences and applies the currently applicable operating context at each point in the simulation.

The invention discloses a method for semi-automatically generating a mixed-signal or analog model based on iterative probing of an existing device or behavioral simulation.

The invention teaches a method for model abstraction to alter the level of detail present in a running simulation. A means for graphically evaluating the match quality constitutes the final innovative step.

The innovative method for the formal comparison of two analog or mixed signal models within a prescribed operating range for each interface between the model and its environment without the need for exhaustive simulation.

10 Claims, 23 Drawing Sheets

U.S. PATENT DOCUMENTS

| | | | |
|---|---|---|---|
| 4,937,770 A | 6/1990 | Samuels et al. | |
| 4,967,386 A | 10/1990 | Maeda et al. | |
| 4,972,334 A | 11/1990 | Yamabe et al. | |
| 4,985,860 A | 1/1991 | Vlach | |
| 5,018,089 A | 5/1991 | Kanazawa | |
| 5,105,373 A | 4/1992 | Rumsey et al. | |
| 5,111,413 A | 5/1992 | Lazansky et al. | |
| 5,146,583 A | 9/1992 | Matsunaka et al. | |
| 5,297,066 A | 3/1994 | Mayes | |
| 5,329,470 A | 7/1994 | Sample et al. | |
| 5,335,191 A | 8/1994 | Kundert et al. | |
| 5,361,373 A | 11/1994 | Gilson | |
| 5,392,429 A | 2/1995 | Agrawal et al. | |
| 5,418,953 A | 5/1995 | Hunt et al. | |
| 5,448,496 A | 9/1995 | Butts et al. | |
| 5,455,938 A | 10/1995 | Ahmed | |
| 5,467,291 A * | 11/1995 | Fan et al. | 703/14 |
| 5,477,475 A | 12/1995 | Sample et al. | |
| 5,481,484 A | 1/1996 | Ogawa et al. | |
| 5,528,508 A | 6/1996 | Russell et al. | |
| 5,574,893 A | 11/1996 | Southgate et al. | |
| 5,579,494 A | 11/1996 | Zaiki | |
| 5,604,911 A | 2/1997 | Ushiro | |
| 5,655,075 A | 8/1997 | Saito et al. | |
| 5,657,241 A | 8/1997 | Butts et al. | |
| 5,682,392 A | 10/1997 | Raymond et al. | |
| 5,710,901 A | 1/1998 | Stodghill et al. | |
| 5,715,184 A | 2/1998 | Tyler et al. | |
| 5,715,373 A | 2/1998 | Desgrousilliers et al. | |
| 5,752,000 A | 5/1998 | McGeer et al. | |
| 5,757,678 A | 5/1998 | Leeke | |
| 5,768,159 A | 6/1998 | Belkadi et al. | |
| 5,768,160 A | 6/1998 | Kakegawa | |
| 5,768,562 A | 6/1998 | Heile et al. | |
| 5,768,567 A | 6/1998 | Klein et al. | |
| 5,774,693 A | 6/1998 | Hsu et al. | |
| 5,784,591 A | 7/1998 | Kageshima | |
| 5,794,005 A | 8/1998 | Steinman | |
| 5,801,938 A | 9/1998 | Kalantery | |
| 5,802,349 A | 9/1998 | Rigg et al. | |
| 5,821,773 A | 10/1998 | Norman et al. | |
| 5,822,567 A | 10/1998 | Takeuchi | |
| 5,835,751 A | 11/1998 | Chen et al. | |
| 5,867,397 A * | 2/1999 | Koza et al. | 703/14 |
| 5,867,399 A | 2/1999 | Rostoker et al. | |
| 5,870,588 A * | 2/1999 | Rompaey et al. | 703/13 |
| 5,913,051 A | 6/1999 | Leeke | |
| 5,949,992 A | 9/1999 | Kundert | |
| 5,956,261 A | 9/1999 | Blaauw et al. | |
| 5,999,734 A | 12/1999 | Willis et al. | |
| 6,009,256 A | 12/1999 | Tseng et al. | |
| 6,009,259 A | 12/1999 | Ikeda et al. | |
| 6,097,885 A | 8/2000 | Rayner | |
| 6,108,494 A | 8/2000 | Eisenhofer et al. | |
| 6,263,301 B1 | 7/2001 | Cox et al. | |
| 6,321,366 B1 * | 11/2001 | Tseng et al. | 716/6 |
| 6,427,224 B1 * | 7/2002 | Devins et al. | 716/4 |

OTHER PUBLICATIONS

Maurer et al., "Gateways: A Technique for Adding Event-Driven Behavior to Compiled Simulations", IEEE Transactions on Computer-Aided Design of Integrated Circuits and Systems, vol. 13, No. 3, Mar. 1994, pp. 338-352.

Gai et al., "Creator: New Advanced Concepts in Concurrent Simulation", IEEE Transactions on Computer-Aided Design of Integrated Circuits and Systems, vol. 13, No. 6, Jun. 1994, pp. 786-795.

Balkir et al.,"Numerical Integration Using Bezier Splines", IEEE Transactions on Computer-Aided Design of Integrated Circuits and Systems, vol. 13, No. 6, Jun. 1994, pp. 737-745.

Hung et al., "Improving the Performance of Parallel Relaxation-Based Circuit Simulators", IEEE Transactions on Computer-Aided Design of Integrated Circuits and Systems, vol. 12, No. 11, Nov. 1993, pp. 1762-1774.

Brand, "Exhaustive Simulation Need Not Require and Exponential Number of Tests", IEEE Transactions on Computer-Aided Design of Integrated Circuits and Systems, vol. 12, No. 11, Nov. 1993, pp. 1635-1641.

Griffith et al., "Mixed Frequency/Time Domain Analysis of Nonlinear Circuits", IEEE Transactions on Computer-Aided Design, vol. 11, No. 8, Aug. 1992, pp. 1032-1043.

Parlakbilek et al., "A Multiple-Strength Multiple-Delay Compiled-Code Logic Simulator", IEEE Transactions on Computer-Aided Design of Integrated Circuits and Systems, vol. 12, No. 12, Dec. 1993, pp. 1937-1946.

Lewis, "A Compiled-Code hardware Accelerator for Circuit Simulation", IEEE Transaction on Computer-Aided Design, vol. 11, No. 5, May 1992, pp. 555-565.

Maurer, "Two new Techniques for Unit-Delay Compiled Simulation", IEEE Transactions o Computer-Aided Design, vol. 11, No. 9, Sep. 1992, pp. 1120-1130.

Saviz et al., "Circuit simulation by Hierarchical Waveform Relaxation", IEEE Transactions on Computer-Aided Design of Integrated Circuits and Systems, vol. 12, No. 6, Jun. 1993, pp. 845-860.

Maurer, "The Shadow Algorithm: A Scheduling Technique for Both Compiled and Interpreted Simulation", IEEE Transactions on Computer-Aided Design of Integrated Circuits and Systems, vol. 12, No. 9, Sep. 1993, pp. 1411-1424.

Bailey, "How Circuit Size Affects Parallelism", IEEE Transactions on Computer-Aided Design, vol. 11, No. 2, Feb. 1992, pp. 208-215.

Lewis, "A Hierarchical Compiled Code Event-Driven Logic Simulator", IEEE Transactions on Computer-Aided Design, vol. 10, No. 6, Jun. 1991, pp. 726-737.

Ruan et al., "Analog Functional Simulator for Multilevel Systems", IEEE Transactions on Computer-Aided Design, vol. 10, No. 5, May 1991, pp. 565-576.

Odent et al., "Acceleration of Relaxation-Based Circuit Simulation Using a Multiprocessor System", IEEE Transactions on Computer-Aided Design, vol. 9, No. 10, Oct. 1990, pp. 1063-1072.

Sadayappan et al., "Efficient Sparse Matrix Factorization for Circuit Simulation on Vector Supercomputers", IEEE Transactions on Computer-Aided Design, vol. 8, No. 12, Dec. 1989, pp. 1276-1285.

Yu et al., "efficient Approximation of Symbolic Network Functions Using Matroid Intersection Algorithms", IEEE Transactions on Computer-Aided Design of Integrated Circuits and Systems, vol. 16, No. 1, Oct. 1997, pp. 1073-1081.

Maurer, "The Inversion Algorithm for Digital Simulation", IEEE Transactions on Computer Aided Design of Integrated Circuits and Systems, vol. 16, No. 7, Jul. 1997, pp. 762-769.

Ngoya et al., "Newton-Raphson Iteration Speed-Up Algorithm for the Solution of Nonlinear Circuit Equations in General-Purpose CAD Programs", IEEE Transactions on Computer-Aided Design of Integrated Circuits and Systems, vol. 16, No. 6, Jun. 1997, pp. 638-644.

Lee et al., "Bit-Parallel Multidelay Simulation", IEEE Transactions on Computer-Aided Design of Integrated Circuits and Systems, vol. 15, No. 12, Dec. 1996, pp. 1547-1554.

Lumsdaine et al., "Accelerated Waveform Methods for Parallel Transient Simulation of Semiconductor Devices", IEEE Transactions on Computer-Aided Design of Integrated Circuits and Systems, vol. 15, No. 7, Jul. 1996, pp. 716-726.

Ocali et al., "A New Method for Nonlinear Circuit Simulation in Time Domain: NOWE", IEEE Transactions on Computer-Aided Design of Integrated Circuits and Systems, vol. 15, No. 3, Mar. 1996, pp. 368-374.

Saleh et al, "Multilevel and Mixed-Domain Simulation of Analog Circuits and Systems", IEEE Transactions on Computer-Aided Design of Integrated Circuits and Systems, vol. 15, No. 1, Jan. 1996, pp. 68-82.

Yeh, "On the Acceleration of Flow-Oriented Circuit Clustering", IEEE Transactions on Computer-Aided Design of Integrated Circuits and Systems, vol. 14, No. 10, Oct. 1995, pp. 1305-1308.

Eickhoff et al., "Levelization Incomplete LU Factorization and Its Application to Large-Scale Circuit Simulation", IEEE Transactions on Computer-Aided Design of Integrated Circuits and Systems, vol. 14, No. 6, Jun. 1995, pp. 720-727.

Fang et al., "Robust VLSI Circuit Simulation Techniques Based on Overlapped Waveform Relaxation", IEEE Transactions on Computer-Aided Design of Integrated Circuits and Systems, vol. 14, No. 4, Apr. 1995, pp. 510-518.

Li, "The Complexity of Segmented Channel Routing", IEEE Transactions on Computer-Aided Design of Integrated Circuits and Systems, vol. 14, No. 4, Apr. 1995, pp. 518-523.

Kao et al., "Timing Analysis for Piecewise Linear Rsim", IEEE Transactions on Computer-Aided Design of Integrated Circuits and Systems, vol. 13, No. 12, Dec. 1994, pp. 1498-1512.

Casinovi et al., "Multi-Level Simulation of Large Analog Systems Containing Behavorial Models", IEEE Transactions on Computer-Aided Design of Integrated Circuits and Systems, vol. 13, No. 11, Nov. 1994, pp. 1391-1399.

Jain et al., "Efficient Symbolic Simulation-Based Verification Using the Parametric Form of Boolean Expressions", IEEE Transactions on Computer-Aided Design of Integrated Circuits and Systems, vol. 13, No. 8, Aug. 1994, pp. 1005-1015.

Casinovi et al., "A Macromodeling Algorithm for Analog Circuits", IEEE Transactions on Computer-Aided Design, vol. 10, No. 2, Feb. 1991, pp. 150-160.

Archar et al., "Full-Wave Analysis of High-Speed Interconnects Using Complex Frequency Hopping", IEEE Transactions on Computer-Aided Design of Integrated Circuits and Systems, vol. 17, No. 10, Oct. 1998, pp. 997-1016.

Dmitreiv-Zdorov, "Multicycle Generalization—A New Way to Improve the Convergence of Waveform Relaxation for Circuit Simulation", IEEE Transactions on Computer-Aided Design of Integrated Circuits and Systems, vol. 17, No. 5, May 1998, pp. 435-443.

Berman, "VHDL Performance: The Native Code Approach", VHDL International Users' Forum (VIUF) Spring 1993 Conference Proceedings, Ottawa, Canada, Apr. 1993, pp. 155-161.

Smith et al., "An Analysis of Several Approaches to Circuit Partitioning for parallel Logic Simulation", Proceedings 1987 International IEEE Conference on Computer Design, Rye Brook NY, Oct. 1987, pp. 664-667.

Najjar et al., "Parallel Execution of Discrete-Event Simulation", Proceedings 1987 International IEEE Conference on Computer Design, Rye Brook NY, Oct. 1987, pp. 668 671.

Dickens, "A Worstation-Based parallel Direct-Execution Simulator", ACM SIGSIM Simulation Digest, Proceedings of the 1997 Workshop on Parallel and Distributed Simulation, IEEE, vol. 27, No. 1, Jun. 1997, pp. 174-177.

Cai et al., "Dag Consistent Parallel Simulation: A predictable and Robust Conservative Algorithm", ACM SIGSIM Simulation Digest, Proceedings of the 1997 Workshop on Parallel and Distributed Simulation, IEEE, vol. 27, No. 1, Jun. 1997, pp. 178-181.

Booth et al., "Stack-free process-oriented simulation", ACM SIGSIM Simulation Digest, Proceedings of the 1997 Workshop on Parallel and Distributed Simulation, IEEE, vol. 27, No. 1, Jun. 1997, pp. 182-185.

Auslander et al., "Fast, Effective Dynamic Compilation", Programming Language Design and Implementation (PLDI), ACM SIGPLAN Notices, vol. 31, No. 5, May 1996, pp. 149-159.

Engler, "VCODE: A Retargetable, Extensible, Very Fast Dynamic Code Generation System", Programming Language Design and Implementation (PLDI), ACM SIGPLAN Notices, vol. 31, No. 5, May 1996, pp. 160-170.

Collberg, "Reverse Interpretation+Mutation Analysis=Automatic Retargeting", Programming Language Design and Implementation (PLDI), Las Vegas, NV, ACM SIGPLAN Notices, vol. 32, No. 5, May 1997, pp. 57-70.

Diniz et al., "Dynamic Feedback: An Effective Technique for Adaptive Computing", Programming Language Design and Implementation (PLDI), Las Vegas, NV, ACM SIGPLAN Notices, vol. 32, No. 5, May 1997, pp. 71-84.

Netzer et al., "Optimal Tracing and Incremental Reexecution for Debugging Long-Running Programs", ACM SIGPLAN '94 Conference on Programming Language Design and Implementation (PLDI), Orlando, FL, Association for Computing Machinery, vol. 29, No. 6 Jun. 1994, pp. 313-325.

Larus et al., "EEL: Machine-Independent Executable Editing", ACM SIGPLAN '95 Conference on Programming Language Design and Implementation (PLDI) LaJolla, CA, Association for Computing Machinery, vol. 30, No. 6, Jun. 1995, pp. 291-300.

Hanson, "Structural Level Simulation of Analog/Microwave Circuits in VHDL", VHDL Users' Group Spring 1991 Conference, Cincinnati, OH, Apr. 1991, pp. 135-141.

Sama et al., "Behavioral Modeling of RF Systems with VHDL", VHDL Users' Group Sprin 1991 Conference, Cincinnati, OH, Apr. 1991, pp. 167-173.

Kapp et al., "An Improved Cost Function for Static Partitioning of Parallel Circuit Simulations Using a Conservative Synchronization Protocol", ACM SIGSIM Simulation Digest, Proceedings of the $9^{th}$ Workshop on Parallel and Distributed Simulation, vol. 25, No. 1, Jul. 1995, pp. 78-85.

Shi et al., "Symbolic Analysis of Large Analog Circuits with Determinant Decision Diagrams", IEEE Transactions on Computer-Aided Design, vol. 19, No. 1, Jan. 2000, pp. 1-8.

Carr, *Practical Antenna Handbook*, $2^{nd}$ Edition, TAB Books, a Division of McGraw Hill, Inc., NY, 1994, pp. 347-394.

Even, Section 6.4 "Maximum Matching in Biparite Graphs", *Graph Algorithms*, Technion Institute Haifa, Israel, 1979, pp. 135-138.

Gajski et al., Section 5.3 and 5.4 HDL Compilation "Representation of HDL Behavior", *High Level Synthesis: Introduction to Chip and System Design*, Kluwer Academic Publishers, MA 1997, pp. 144-157.

Zargham, Section 1.1-1.5 "Routing Techniques" *Routing, Placement, and Partitioning*, Ablex Publishing Corporation, NJ 1994, pp. 1-27.

Zhang, Chapter 4, "VLSI Placement", *Routing, Placement, and Partitioning*, Ablex Publishing Corporation, NJ 1994, p. 121-137.

Saab et al., Chapter 5, "Partitioning", *Routing, Placement, and Partitioning*, Ablex Publishing Corporation, NJ 1994, pp. 182-205.

IEEE Standard 1076.1, IEEE Standard VHDL Language Reference Manual Integrated with VHDL-AMS Changes, 1999, pp. 31-32, 55-57, 67-69, 82, 194-198, 260-264.

Jones et al., "A Cache-Based Method for Accelerating Switch-Level Simulation", IEEE Transactions on Computer-Aided Design of Integrated Circuits and Systems, vol. 13, No. 2, Feb. 1994, pp. 211-218.

Kielkowski, Inside SPICE: Overcoming the Obstacles of Circuit Simulation, McGraw Hill 1994, Chapters 1-2, pp. 1-41.

Lewis, A Compiled-Code Hardware Accelerator for Circuit Simulation, IEEE Transactions on Computer-Aided Design, vol. 11, No. 5, May 1992, pp. 555-565.

McCalla, "Fundamentals of Computer-Aided Circuit Simulation", Lkuwer Academic Publishers, 1998, pp. 1-85.

Rodrigues, "Computer-Aided Analysis of Nonlinear Microwave Circuits", Artech House Publishers, 1998, Chapter 4, pp. 105-146.

Rodrigues, "Computer-Aided Analysis of Nonlinear Microwave Circuits", Artech House Publishers, 1998, Chapter 6, pp. 179-227.

Vlach et al., "Network Equations and Their Solution", Computer Methods for Circuit Analysis and Design, Van Nostrand Reinhold, 1994, pp. 31-93.

* cited by examiner

Figure 4

```
(210) subtype voltage is real;
(211) subtype current is real;
(212) nature tap is voltage across current;
(213) nature taps is array <> of tap;
(214) procedure transmission_line (t: taps) is
(215)    begin
(216)       -- VHDL RF/MW implementation of transmission line
(217)    end procedure transmission_line;
(218) subnature trace is transmission_line taps;
(219) terminal board_trace: trace;
```

Extract from example of VHDL-RF/MW model source code(201)

SEMI-AUTOMATIC GENERATION OF BEHAVIOR MODELS CONTINUOUS VALUE USING ITERATIVE PROBING OF A DEVICE OR EXISTING COMPONENT MODEL

CROSS-REFERENCE TO RELATED APPLICATIONS

This application claims the benefit of U.S. Provisional Application No. 60/331,887 filed on Nov. 21, 2001, entitled "METHOD FOR SEMI-AUTOMATIC GENERATION AND BEHAVIORAL COMPARISON OF MODELS," the contents of which are incorporated herein by reference.

REFERENCE TO GOVERNMENT

This invention was made with Government support under Contract No. F30602-98-C-0046 awarded by the United States Air Force. The Government has certain rights in this invention.

BACKGROUND OF THE INVENTION

Simulating the behavior of a proposed or actual design reduces the effort required to realize and maintain the design. Before expending the time and resources to realize a design, designers may compare the desired and predicted behavior of a design using simulation. After realizing the system into dedicated hardware and software and throughout the design's lifecycle, simulation facilitates understanding of unexpected design behaviors and subsequent evaluation of proposed design modifications.

When designers employ a general purpose computer or special purpose simulation accelerator to conduct simulation, the simulated design behavior is usually many times slower than the realized design. Using simulation to predict the design's behavior over lengthy periods of simulated time generally requires undesirably long periods of actual or wallclock time, perhaps consuming days to simulate a mere second in the lifetime of the realized design. Delays before simulation results are available incur an expense in time, an expense in computing resources and delay initial design realization or modification. Therefore methods for improving simulation speed and accuracy, such as those taught in the present invention, are useful and valuable.

Design behavior may be simulated at many different levels of detail. Abstract models of design behavior, with comparatively little detail generally simulate comparatively fast. By adding more detail to the model of a design, the predicted and actual design behavior generally converge while the rate of simulated and actual design behavior diverge. Equivalently, simulation generally becomes increasingly slower as the accuracy of detail increases.

The most abstract simulations, and thus faster simulations, generally approximate the design's state to discrete values in both value and time. Such simulations are commonly known as "digital". Simulations with more accurate detail represent a design using continuous values and time. Such continuous simulations are known as "analog". Due to the speed penalty associated with analog simulation, large system simulations typically utilize a mixture of digital and analog simulation techniques, known as mixedsignal simulation. Simulations using a mixture of digital and analog detail are known as "mixed signal". The most accurate simulations represent a design using physically continuous fields and wave propagation, such as electronic and magnetic fields embodied-in Maxwell's equations (and continuity equations). Such accurate but slow simulations are often known as "full wave" simulations.

More detailed simulations are not only slower, they impose a significant effort on the design team in order to accurately "model" a system's behavior so that it can be simulated. Designers or model extraction tools typically represent a design's behavior using one or more modeling languages. Structure modeling languages, such as SPICE, represent a system in terms of flat or hierarchically connected components. A structural modeling language represents terminal components using behavioral models described using a conventional programming language, such as C or Fortran, or a behavioral modeling language, such as VHDL or Verilog (digital), VHDL-AMS or Verilog-AMS (mixed signal). Radio frequency and microwave (RF/MW) languages, perhaps augmenting a base language such as VHDL-AMS or Verilog-AMS, typically add modeling language features such as means for modeling distributed (rather than lumped) parameter components, means for component modeling in the frequency domain (rather than just the time domain) and means of effectively modeling noise and parasitic interactions.

A conventional programming language or behavioral modeling language represents system behavior using terminals, branches and equations representing an implicit relationship between quantities (the implicit relationship embodied as Kirchoff's laws for the analog and mixed signal or Maxwell's and continuity equations for full-wave modeling). Terminals, sometimes known as "nodes", represent the connection point between two or more branches. The network formed by terminals connected by branches may be represented as one or more disconnected graphs embodying terminals and branches with associated across quantities, such as voltage, and through quantities or contributions, such as current.

FIG. 1 represents the relationship between terminals (such as 152, 154, 156, 159, 162, 164, 166 and 168), branches (such as 153, 155, 157, 158, 163, 165, 167, 169) and implied quantities such as through quantity Q2 (172) or across quantity Q1 (151). Well known techniques provide for partitioning analog models which do not share terminals, branches or quantities, such as the partitions marked 150 and 169 in FIG. 1. Recognizing such partitions early in the compilation process will become useful in the present invention; means for recognizing such disconnected partitions are well-known.

Beyond a structural view-embodied in terminals, branches and quantities, analog modeling languages enable declaration and reference to continuously valued state variable quantities representing physical properties, such as voltage or current, and quantities implicitly or explicitly derived from such quantities. Mixed signal modeling languages enable reference to digital objects such as signals, shared variables, registers and comparable, discretely-valued objects. Such digital objects may be contained in a distinct digital partition, such as 170 in FIG. 1 and referenced from both the digital partition and zero or more analog partitions, such as 150 or 169 in FIG. 1.

Source code references in a model using a mixed signal language, such as VHDL-AMS, Verilog-AMS or MAST, typically take the form of one or more constraints relating left and right hand side expressions at a specific instant in time to within an implicit or explicit tolerance. Sets of such equations referencing common quantities and digital objects (a partition) are commonly known as systems of equations, characteristic equations, simultaneous equations or constraint equations. Without loss of generality we will refer to these as equation systems in the following.

Many designs of practical interest build on algebraic differential equations by using integrals and differentials of quantities with respect to time (ordinary differential equations) or other state variables (partial differential equations). Three examples will help to illustrate the key differences. An idealized voltage source and resistor tree used as a voltage divider can readily be described using an algebraic equation system. A perfect capacitor integrates change over time, requiring an ordinary differential equation to describe an idealized voltage source driving a resistor and capacitor design. A pair of conductors in close proximity, driven by distinct signal sources generally requires a partial differential equation to model the voltage induced by one conductor on the second conductor.

The behavior of an analog partition may be modeled in the time domain (primary independent variable is time) or in the frequency domain (primary independent variable is frequency). For example the behavior of a voltage-controlled oscillator may be most conveniently modeled in the time domain whereas the transfer function of a filter or amplifier may be most easily and compactly captured in the frequency domain. The prior art effectively addresses many aspects of modeling in either domain, however prior art does not effectively address tight integration of digital inputs, analog time domain behavior and analog frequency domain behavior into a common analog partition or partitions.

Techniques are well-known to convert structural representations, such as commonly evolve from use of the SPICE modeling language using terminals and branches, into systems of equations. With this well-accepted transformation in mind, further discussion will speak of equation systems with the understanding that these systems may originate in many forms, including structural and graph-oriented languages.

The left or right hand side of inequalities within an equation system may result from evaluation of substantially complex expressions involving constructs such as procedural control flow, conditional statements and analog events. Without loss of generality, such notations may be compiled into a variety of equivalent forms corresponding to sets of equation systems where an expression and evolving state may be evaluated to identify an active equation system at any instant in time from among the set of equation systems potentially modeling an analog, mixed-signal or full-wave partition's behavior. Each such equation includes one or more language-defined means for evaluating an identifiable value or range of values on the left and right side of each inequality within the equation system. Such values are generally known to have either scalar or composite type.

From one instant in time to another, both quantity values and the equation system which is active within a set of equations systems describing an analog partition may change. The change may be implicit in the set of equations and therefore must be detected during simulation or may be explicitly denoted, as with a "break" statement denoting an expected discontinuity. For example, the model of a digital to analog converter commonly has such instantaneous discontinuities explicitly corresponding to changes in the digital value which is to be converted by the design into an analog value.

Behavioral, mixed-signal modeling languages, such as VHDL-AMS and Verilog-AMS, interleave or alternate simulation of analog and digital design partitions, increasing the opportunity for discontinuities between quantity values at two successive points in time. Digital values may be referenced in an analog partition by direct reference (such as VHDL-AMS) or by explicit interface mechanisms (such as Verilog-AMS). Analog quantities may be referenced in a digital partition directly, via threshold language mechanisms (such as VHDL-AMS) or via more complex interface mechanisms (such as Verilog-AMS).

Although common mixed signal modeling languages provide a wide variety of lexical and syntactic abbreviations which expand during analysis into equivalent sets of equation systems or sequential, imperative processes, the case of physically distributed terminals represent a very important exception. Modeling detail required to accurately represent such constructs depends critically on the operating frequency and other context generally only known during simulation. For example, accurate models of a transmission line expand at low frequency from a lumped parameter to a complex distributed parameter model at higher operating frequencies. In a like manner, an antenna's radiation pattern expands from a trivial, open-circuit static model at DC to a complex finite element model within interactions described by Maxwell's equations and continuity at more interesting frequencies.

From the standpoint of modeling practicality and accuracy, it is very useful for a design team to employ an incremental evolution of partition modeling detail, based on the design and thus simulation's actual operating domain, from a digital view, through an analog lumped parameter component model view, through a distributed parameter component model view, into a full-wave model view. Knowledge of the changing implementation internal to the component is then primarily modeled by a technology specialist associated with the design effort. Such a technology encapsulation and encapsulated continuity of views is not found in prior art. Anticipating this innovative modeling language step, we will thus consider the definition of analog partitions to embrace components of the partition which are lumped, distributed or full-wave in detail without loss of generality.

While representational languages and simulators exist to capture and simulate high-frequency phenomena, simulation delivers greater utility to a designer when high-frequency phenomena (lumped, analog and full-wave views) are transparently, selectively and semi-automatically conditionally introduced into the design representation in which the remainder of the system has been represented, using languages such as VHDL, VHDL-AMS, Verilog and Verilog-AMS. VHDL already provides a descriptive language mechanism by which physical phenomena such digital phenomena as tri-state and open-collector/emitter interconnect technology may be semi-transparently introduced into simulation while being ignored during uses such as the synthesis of hardware. The mechanisms are known as "resolution" functions.

VHDL resolution functions for digital interconnects, well-known prior art, may be associated with an existing type to form a new, resolved, subtype. The new, resolved subtype may then be used to define a "resolved signal". At a specific point in time, the signal may appear on the left hand side (assignment target) of digital equations. After all assignments have taken place at each identifiable point in time at which any equations assign to the specific resolved signal, the resolution function originally associated with the signals subtype conceptually executes. Execution of this resolution function takes specific assigned values to the signal as inputs and returns a resolved value representing the tri-state, open-collector or other resolution behavior. The array of inputs and resolution function return value may either be an array of scalar types resolved to a scalar type or may hierarchically resolve a composite type consisting of zero or more composite scalar types.

The number of distinct inputs to a resolution function may not be known until after a system begins simulation. Some inputs to a resolution function may not actually be assigned at all or may not be assigned during a specific period of time. Conversely, during simulation additional drivers may be added which assign to a signal. Addition may occur as a result of executing the mixed signal design representation or more commonly through execution of a programming language fragment introduced through a programming language interface (PLI) to the system representation. In the prior art, code generated to perform simulation must accommodate the worst case resolution context and thus is less efficient than if code was generated for the actual number of active inputs to the resolution functions. Commonly resolved signals are driven by an expression's left hand side (or functionally equivalent left hand sides within a process) via the process equivalent's driver. Often the resolution function call for such signals may be eliminated or significantly simplified, for example if there is only one driver, thus improving performance.

During elaboration of a design hierarchy, the worst case number of drivers to a signal will be known in the absence of programming language interface calls creating a new driver. During a particular instant of simulation time, the exact number of drivers will be known. Unfortunately in the prior art, code implementing the resolution is commonly fixed prior to elaboration or at best prior to simulation. Thus the code implementing resolution embodies efficiencies associated with the more general case rather than the actual use. In the average case, this flexibility slows simulation.

Most analog design partitions of practical interest are non-linear. Non-linear systems include terms within their system of equations which depend on quantities or expressions involving quantities taken to powers other than one. For example, a non-linear component model may depend on the square of the voltage across a pair of terminals. Systems comprising non-linear components are computationally more complex to simulate and thus slower than linear system simulations.

Thus without loss of generality, in the following we may consider designs to be modeled using zero or more analog partitions and zero or more digital partitions. Each partition may refer to digital objects (such as signals or shared variables), analog objects (such as quantities or terminals) or values derived from these objects. Generally analog partitions and full wave partitions (subset of analog partitions) set the value of analog objects. Digital partitions set the value of digital objects. Sets of equation systems, of which one is identifiably active at any instant in time, represent behavior of each analog partition. Sets of concurrent processes, each conceptually having a sequential and imperative behavior, represent behavior of each digital partition. So as to focus on the innovations offered herein, the following will focus on this generalized representation of the design's model without implying exclusion of various equivalent design representations.

The set of all objects (analog and digital) referenced by a partition forms an operating space, such as the example shown in FIG. 2. The domain of values which a given object may assume (based on its subtype) forms an axis of the operating space (such as 50, 51 or 52 in FIG. 2). A partition's operating space has one dimension for each scalar element of each object. The three dimensions shown in the example of FIG. 2 correspond to two analog quantities A (50) and B (51) and open digital object, perhaps a signal (52).

Each dimension of the partition's operating space may be divided. When combined with divisions of other dimensions, this forms a subspace of the operating space or an operating context (by which it will be subsequently known). Operating points contained within a single context have closely related values.

During intervals time during simulation of a design's behavior, the observed object values can be contained within an operating context. Within the operating context, the non-linear system of characteristic equations can be approximated by a linear model. Techniques for deriving such approximations, known as "linearization" techniques, are well-known in the literature. At any point in a simulation, the analog partition is operating in a single, identifiable operating context with a corresponding linearization of an equation system (currently) representing the analog partition's behavioral model.

For the models of most designs, over time the analog partition will evolve during simulation through multiple operating contexts, corresponding to multiple linearizations of equation system(s). However as simulation continues, the total set of operating contexts being traversed typically develops a working set of operating contexts which encountered repeatedly, generally to the exclusion of new operating contexts.

Prior art commonly transforms equation systems, prior to the onset of simulation, into various implementations relating across and through quantity vectors by a sparse matrix. A sparse matrix implementation takes advantage of many zero-valued "conductance" matrix values to achieve substantially more compact representations than the square of the array dimensions would imply. Prior art teaches a variety of transformations on the sparse matrix representations which reduce the magnitude of off-diagonal elements (toward zero) and thus accelerate simulation. However for designs of practical interest, the off-diagonal elements of the conductance matrix are seldom all zero.

During simulation, software commonly known as an "analog-solver" iterates through an interpretation of the sparse matrix so as to identify across and through quantity values immediately consistent with the system of equations compiled into the sparse matrix formulation (and thus representing the analog partition's immediate model behavior). Integration and differentiation techniques for handling equation terms which are the time differential (such as an inductor model) or time integral of quantities (such as a capacitor model) are a well-documented aspect of the prior art.

Numerous techniques for approximating equivalence between left and right hand sides of a transformed characteristic equation by adjusting quantity values are another well-documented aspect of the prior art central to implementation of an analog solver. If transformed sides of a characteristic equation were required to match exactly at the end of each successful analog solver cycle, many simulations would fail to converge and thus terminate after reaching an iteration or time limit. At the possible expense of long-term simulation accuracy, most analog and mixed-signal modeling languages and simulators accept a tolerance within which left and right hand sides are considered to match.

In prior art, models implemented in programming languages, such as C or Fortran, are commonly compiled before execution. Compilation results in compiled assembly or binary machine code common to all operating points and across all discontinuities. Compiled code may refer to multiple lookup tables representing the relationship between across and through quantities. However in prior art, compilation completes before simulation begins and thus cannot benefit from any contextual information know only during and after simulation, thus decreasing simulation performance.

Prior art also teaches techniques by which the current and voltage relationships within an operating context may be approximated by one or more tables. Such tables are constructed prior to simulation, then interpreted by machine instructions common to more than one operating context. Significantly, the innovations taught here allow optimization of the machine instruction sequences for a specific operating context.

If an analog solver is split across more than one processor (multiprocessor), the lack of contextual information encountered when practicing prior art has an even more severe performance impact than with a single processor. In a sparse matrix implementation, it is difficult or impossible to predict and schedule reference patterns so as to effectively schedule multiple processors or functional units to execution distinct portions of the same analog solver, to avoid cache to cache conflicts or to avoid locking of data structures (and thus performance degradation due to contention). As a result, speed-ups in the analog solver resulting from additional processors are generally accepted in the prior art as significantly below the idealized (and desirable) linear speed-up curve. For example, with the prior art, four processors execute an analog simulation at significantly slower than one quarter the rate of a single processor.

Electronically re-configurable logic devices, such as field programmable gate arrays (FPGAs), are often used to accelerate simulation designs at digital levels of abstraction, either in the form of emulators or simulation accelerators. The parallelism available inside of such devices results in substantial speedups relative sequential simulation execution through the execution pipeline of a single processor or a modest number of processors within a multiprocessor. Prior art does not teach any efficient means for utilizing the parallelism of electronically re-configurable logic devices for the simulation of analog, mixed-signal or full-wave abstraction levels.

At least one electronically re-configurable logic device has been fabricated with electronically re-configurable analog modules, such as amplifiers and filters. From the standpoint of simulation use, this device substantially lacks accuracy, noise-immunity, dynamic range, capacity and flexibility required for effective simulation of analog, mixed-signal or full-wave abstractions. Fundamentally it represents quantity values as actual analog values rather than as their sampled digital equivalents.

For ease of reading following current common use, the following will refer to FPGA devices although the references are understood to generalize to the broader class of electronically re-configurable logic devices (no matter what their architecture or market positioning). The references to FPGA are understood to embrace electronically re-configurable interconnects, memory arrays and various configurations of logic cells from fully programmable gates to large logic blocks where only selective interconnect and functionality aspects are electronically programmable.

Large designs, especially when modeled at analog, mixed-signal or full-wave levels of abstraction may readily become too large to fit on a single electronically re-configurable logic device or FPGA, requiring partitioning of a single design across more than one such device to efficiently perform simulation. As device density increases the number of logic gates and storage elements inside FPGA, the number of gates and elements on the device increases as the square whereas the number of pins or ports available to communicate on and off the device increase linearly. As a result, pins on and off the device become an increasingly limiting resource. Efforts to form and bond pads away from the FPGA's periphery help to reduce this problem at the cost of internal logic and memory functionality. However, off-chip interconnects are still more power-intensive than on-chip interconnects, resulting in an increasing incentive to reduce the number of off-chip interconnects required to fulfill a given functionality.

Prior art either maps digital signals directly to pins and traces connecting the pins of various devices or time-multiplexes several signals on the same pins. Commonly the value of a quantity at one time step numerically differs relatively little from the value at the next time step. This is especially true for analog, mixed-signal and full-wave quantities, however the same observation can be made to a lesser degree in the context of digital values. Inefficient use of scarce interconnect resources, as prior art does, results in less effective use of electronically re-configurable logic devices, requiring more devices to partition a design. Dividing a design into additional devices increases cost and slows simulation.

Although the pins of electronically re-configurable logic devices are becoming a limiting factor to effective design size and cost, it is also difficult to implement many arithmetic operators with both high precision and wide dynamic range on a given electronically re-configurable logic array. Frequently designs must accommodate the worst-case precision and range requirements in an operating specification. If the configured device in operation operates outside this specification, overflow, underflow or loss of precision may lead deviations between behavior of a design model and a realized design, ultimately having the potential to cause design failure.

Quantity values in the prior art rely almost exclusively on floating point representations (consisting of a mantissa, implied base and exponent). Since general purpose processors efficiently execute a small number of numeric representations (corresponding to those defined into the processor's instruction set and realization), use of floating point representations are the easiest way to gain increased range. However use of floating point representations has several significant drawbacks, especially in the context of FPGA implementations designed for maximum performance. Even serial implementations of floating point operators are significantly larger and more complex than integer representations, putting FPGA logic at a premium. Normalization and related floating point operations inherently require more time to execute than equivalent integer implementations. Numerical precision is much more difficult to formulate than for integer operations since precision changes as floating point values deviate from a central value, typically 1.0. Finally the flexibility of FPGA logic enables fabrication of almost arbitrary precision integer arithmetic logic, providing alternatives to floating point representation in order to increase usable numerical dynamic range.

Failure associated with overflow, underflow or loss of precision may only be avoided in the prior art through over-design of the specifications or careful and tedious exception handling. Given finite implementation resources, over-design must come at the expense of both decreased functionality and increased power consumption. Over-design throughout a design generally results in a significant decrease to both the design's user functionality and power, yet it only delays the potential for failure due to overflow, underflow or loss of precision.

Designs typically embody existing intellectual property, such as cell libraries or even entire microprocessors. For business reasons, owners of this intellectual property want to export models representing the behavior of these components while restricting the level of implementation or realization detail exposed. Previously such models either used code compiled into assembly language, such as the Synopsys Smart Model or inserted actual devices into the simulation, as in the Logic Modeling Real Chip product.

Compiling component models into an assembly code format is only useful when executing simulation on a general purpose processor for which a compiled representation exists. Such models must be decrypted before simulation begins, leading to the potential for disassembly of the model's assembly code representation and thus compromise of the owner's intellectual property. As an alternative to an assembly code model, prior art describes how to insert actual devices into a simulation.

Inserting actual devices requires an expensive test set in order to operate the isolated device with a suitable speed, timing, power and cooling. Prior art capable of introducing an actual device into a simulation do not address simulation at the analog, mixed-signal or full-wave abstraction levels. Prior art implies substantial time and therefore cost resulting from the need to maintain the chip's specific operating environment. These are important disadvantages to widespread use.

Development of accurate analog, mixed-signal, and full-wave models of a design or design component is time consuming and error-prone. In the prior art, such models tend to evolve manually, with ever-increasing complexity attempting to adapt existing models to new requirements or operating conditions. Even the evolution of such models requires specialized designer skill, a skill which is often in short supply.

Accurate analog, mixed-signal and full-wave models are essential to the synthesis of new analog designs, the retro-fit of existing designs and the modeling of complex designs with one or more missing component models. The prior art offers techniques for manually fitting a model around characterization of operating specifications, however both the gathering of such specifications and the effective fitting of data to achieve a new model is a slow, manual process in the prior art. The cost and time expenditure implicit in such a manual process are a significant disadvantage of the prior art.

Effective comparison techniques are a significant intermediate step in enabling the effective, semiautomatic generation of analog, mixed-signal and full wave component models. Such comparison provides an essential calibration in the process of semiautomatically developing a new analog, mixed-signal or full-wave model corresponding to an existing simulation or actual device. The most powerful prior art available to compare analog, mixed-signal or full-wave models relies on exhaustive simulation of a reference and comparison model under a wide variety of operating conditions.

Comparison of analog, mixed-signal or full-wave models via exhaustive simulation is both time consuming and ultimately fragile. Since it is not possible to simulate all operating modes in a bounded time, the risk of missing a key difference in the behavior of reference and comparison model must remain. Even the time required to conduct enough simulation to approach a given confidence level increases beyond practical limits as the complexity of devices being compared increases.

Textual comparisons of reference and comparison models are especially fragile. Models with closely related lexical and syntactic constructs may exhibit radically different behaviors. For example, a function which approaches positive infinity from one side of a critical value and negative infinity on the other side, of the critical value will be extremely sensitive to behavior around this critical value. Conversely a trignometric function and its Taylor expansion can be lexically and syntactically very different, yet yield acceptably equivalent values over an interesting operating range. Therefore prior art based on textual comparison, such as the common available textual differencing utilities are of little practical value in the problem of analog, mixed-signal or full-wave model comparison.

SUMMARY OF THE INVENTION

An incremental compilation and execution method is taught for the optimized simulation of analog and mixed-signal designs using programmable processors. Prior art utilizes software to implement an analog solver by interpreting a design-specific data structure valid for all Operating Contexts. The innovative method taught herein implements a more efficient analog solver by inserting code fragments compiled for a specific Operating Context into the simulation cycle.

A code fragment for each possible Operating Context may be compiled prior to simulation. Since the num-ber of possible Operating Contexts can be large and comparatively few Operating Contexts will actually be encountered during most simulations, a further method for incrementally compiling analog solver code frag-ments on demand is taught. Once compiled, such code fragments may be retained for subsequent re-use (cached) during the same or subsequent simulation runs.

The method, illustrated in FIG. 8, consists of four primary steps applied to each Analog Partition:

1. Computation of the current Operating Context (350)
2. Map the Operating Context to a Context-Specific Analog Solver (351, 356, 357, 354, 355, 358)
3. Evaluate Context-Specific Analog Solver, updating Analog Object Values and values derived from Ana-log Object Values (352)
4. Compare left and right hand side of equations in Analog Partition against applicable tolerances. If not above tolerance, continue with the Digital Simulation Cycle (359) and then Step 1. If above tolerance, either return directly to Step 1 or exit the loop (Steps 1 to 4 above) at a Breakpoint.

FIG. 7 illustrates a means of computing the Operating Context from the current values of objects refer-enced from the Analog Partition. From each value, the range of values needed to distinguish an Operating Context (see FIG. 2) in which referenced objects have a sufficiently linear relationship are extracted and form a Key (309). The Key (309) may then be used to identify a existing Context-Specific Analog Solver or create an appropriate Context-Specific Analog Solver from the Elaborated Representation (see FIGS. 6, 4) via the Incremental Compiler/Assembler/Loader (see FIGS. 6, 5).

Context-Specific Analog Solvers embody numerical solver algorithms known from the prior art including linearization of Algebraic Equations, Ordinary Differential Equations and Partial Differential Equations about an operating point within the Operating Context, numerical algorithms to update Analog Object Val-ues based on direct or iterative solution (such as Newton/Raphson iteration) and numerical algorithms to integrate or differentiate Analog Objects. As shown in FIG. 11, Context-Specific Analog Solvers may be compiled into General Purpose Processor Instructions (such as 508 and 509) which may direct reference to Object Values via one of the many instruction set effective addressing modes well-known to assembly language programmers and computer designers.

Common Breakpoints include failure to approach tolerances during successive simulation cycles (failure to converge), failure to converge after a specified number of analog solver cycles at the same time point, reach-ing a specific time point, attaining specific object values or matching a specific data access pattern. Other sources of breakpoints are commonly known from the simulator or program debugging literature and are known to those skilled in the art of programming language interface or debugger design.

FIG. 6 illustrates the set of software components typically employed to implement this method. A Source Code Analyzer (1) compiles textual or graphical models of a design to a Post-Analysis Representation (2). A Static Elaborator and Inliner (3) compiles the Post-Analysis Representation (2) into an Elabo-rated Representation (4). An Incremental Compiler/Assembler/Loader (5) then generates General Purpose Processor Instructions (508 and 509) used to implement Context-Specific Analog Solvers (7), Exe-cutable Digital Partitions (8) and Embedded Scheduling Executables (1000 of FIG. 24) needed to sched-ule the execution of Context-Specific Analog Solvers (7) and Executable Digital Partitions (8).

An innovative method is taught for generation of either structural or behavioral mixed-signal models using iterative probing of an existing model embedded in a simulation or an existing device embedded in a test set suitable for applying stimuli and retrieving the response. The technique is useful in the context of analog and mixed-signal simulation as a means to generate suitable textual models from other sources (avoiding the need to co-simulate with other simulators or insert actual devices into a running simulation), as a means of generating more abstract (and thus faster models) as shown in FIG. 9 (453) or for the semi-automatic synthesis of analog components matching a behavioral specification.

FIG. 19 shows the major steps required to practice the method. A Template Library (868) contains an incrementally extended collection of parameterized component templates in an intermediate format (such as FTL Systems' AIRE/CE Internal Intermediate Representation). A Template Selection Step (850), Equation Fitting (852) and Parameter Fitting Step (854) select and refine templates until Model Source Code Genera-tion (856) produces a Textual Representation as Source Code or Intermediate Format suitable for direct compilation into a simulation.

At each of the three steps in the selection and refinement process (Template Selection, Equation Fitting and Parameter Fitting), comparison of the evolving models and either Existing Component Simulation (853) or Actual Device on Interactive Test Set (855) produce an improving match between the observed behavior of reference and comparison models. The Test Model Generation and Analysis component (851) sets up an actual device or simulation for a particular Operating Context, then converse a response into a parametric equation form suitable for Template Selection, Equation Fitting and Parameter Fitting.

FIG. 20 provides additional detail on the Template Library (868) and Template Selection (852). The Template Selection (850) consists of three steps:

1. Matching to a template based on the number of ports and type, establishing the entity (904)

2. Matching based on a Switch-Level Topology

3. Matching based on Equivalent Canonical Equation Forms (906)

Template match (901) produces an incrementally refined match to Template Selection criteria by either generating a template on-the-fly to meet the specification, via the Template Generator (900) or via reference to a previously generated pair of behavioral and structural models. Behavioral models use an Equation System to define the behavior (potentially including conditional constructs and discontinuities between Operating Contexts) as well as a structural equivalent.

An innovative method is disclosed for the Semi-Automatic Behavioral Comparison of Analog and Mixed-Signal Models. The comparison method reduces the need for exhaustive simulation and comparison of simulation results taught in the prior art (and in general practice). Such comparison techniques are particularly useful for practicing "Method for Semi-Automatic Generation of Mixed Signal Models via Behavioral Prob-ing" taught in a concurrent Patent Application.

FIG. 22 illustrates the comparison technique. Reference and comparison models are analyzed into a Post-Analysis Intermediate Representation (900 and 901), Elaborated and Statically In-lined into a Post-Elaboration Form (902 and 903), then converted into a canonical form suitable for graph matching (904 and 905). Comparison methods first attempt to build a correspondence between the two graphs (906). If a cor-respondence can be made, numerical values assigned to nodes and branch values are compared.

If a correspondence between nodes and branches in the Reference and Comparison Model can be made, an innovative graphical representation is useful, as shown in FIG. 23. Icons represent hierarchical struc-ture, objects and equations. Each icon is divided such that portions of the icon may be colored, shaded or otherwise differentiated in appearance. Comparison of the two appearances of each icon provide a visual representation of how closely the reference and comparison structure, objects or equations match by comparing the appearance of distinct icon regions. The match may be either a time-average or may vary dynamically to reflect the immediate difference in value. Structural icons denote the aggregate value of their component structure, objects and equations.

BRIEF DESCRIPTION OF THE FIGURES

FIG. 4 illustrates that incremental terminal expansion may be achieved by associating a distribution procedures with terminals. Technologist may then supply suitable distribution procedures representing specific kinds of interconnect and parasitic behavior.

DETAILED DESCRIPTION OF PREFERRED EMBODIMENTS

In order to accelerate the simulation of designs containing digital, analog, mixed-signal or full-wave components, inter-related innovations in modeling languages, computer software for incremental compilation, computer software for simulation and hardware apparatus for simulation acceleration are useful. This sec-tion teaches the preferred embodiment of such inter-related innovations.

Figure 1:
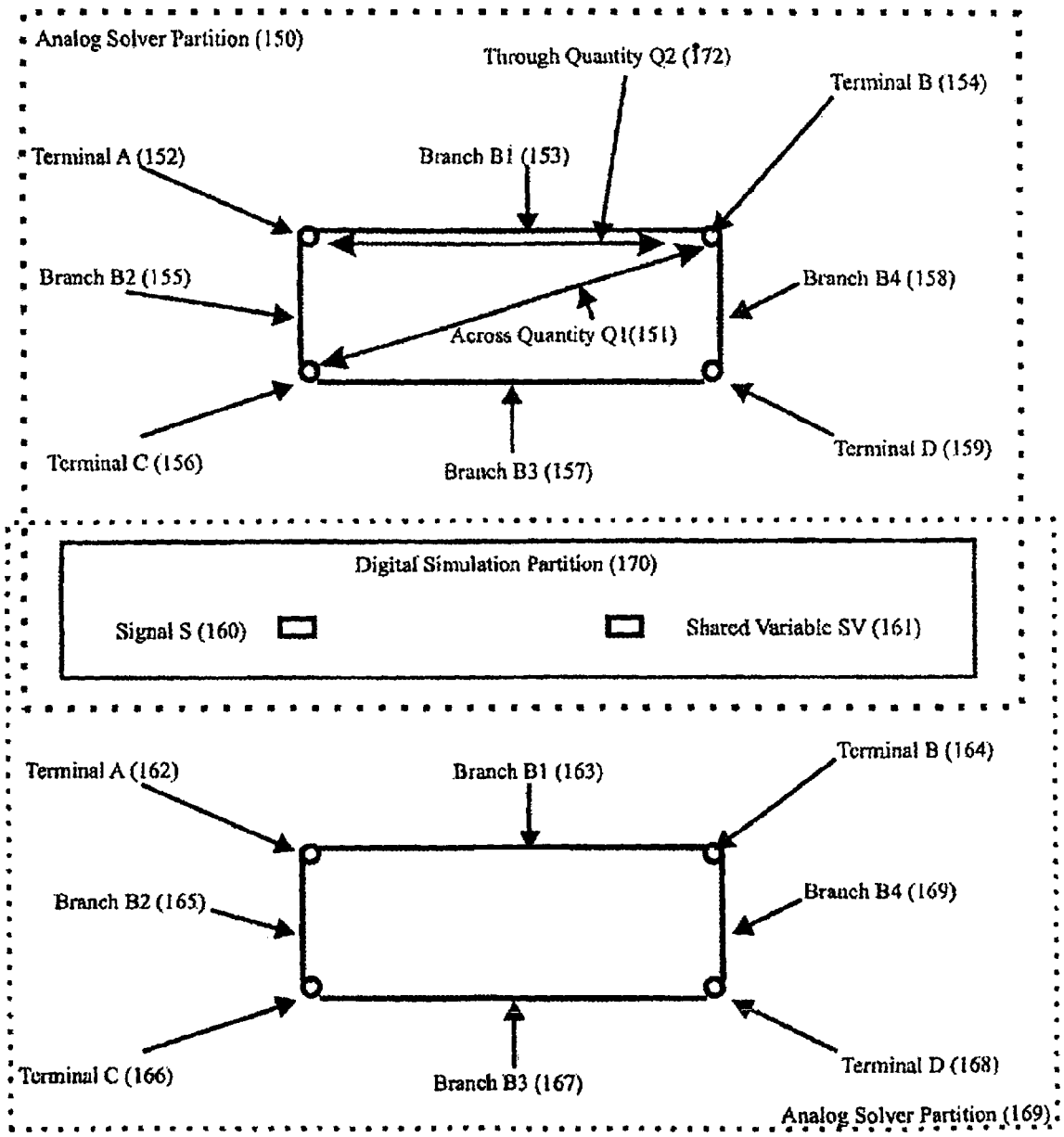
FIG. 1 is a representation of partitioned, mixed signal design illustrating mixed signal objects such as terminals, branches, signals, shared variables, across quantities and through quantities.
Figure 2:
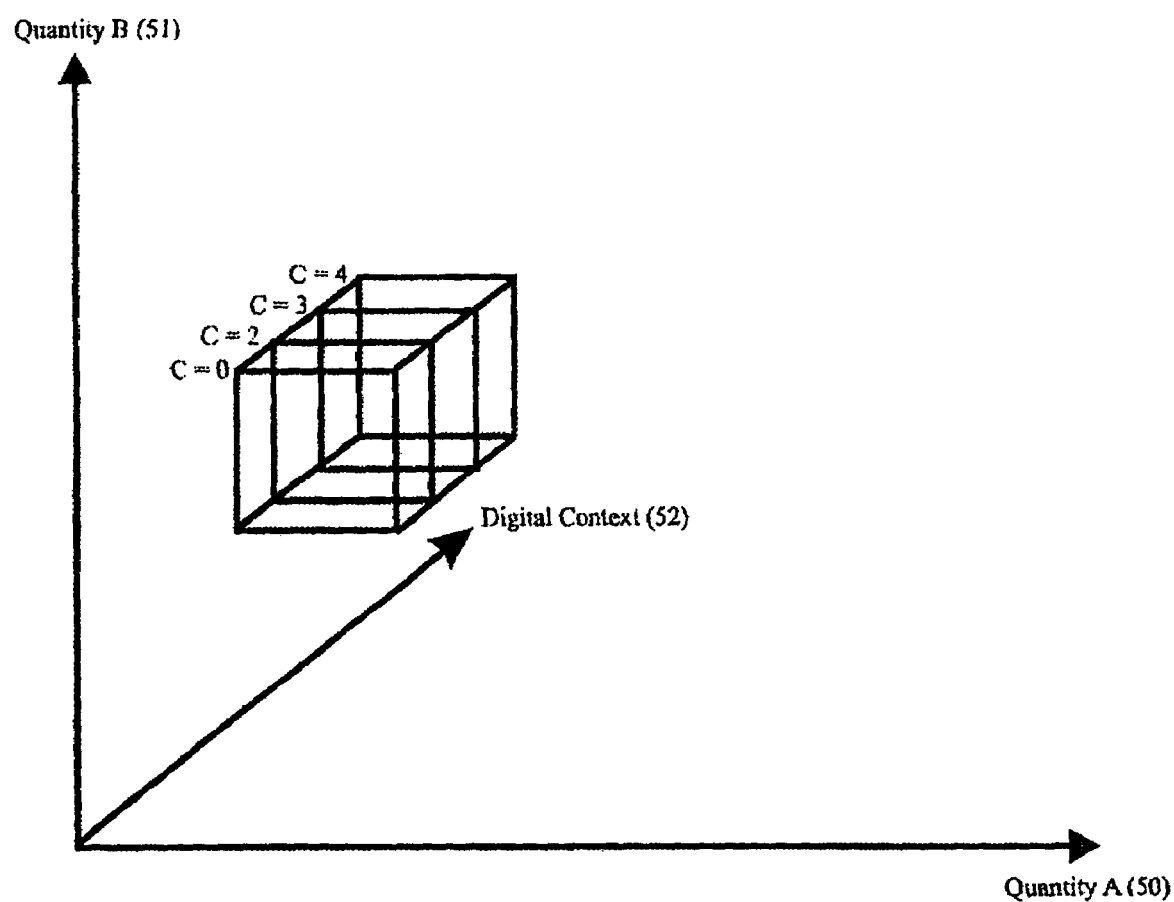
FIG. 2 illustrates that instantaneous values of objects referenced within a logical analog solver partition correspond to a point in the partition's value space. The value space may be divided up into operating contexts. Each context contains those points which may be related by the same, linearized analog solver.
Figure 3:
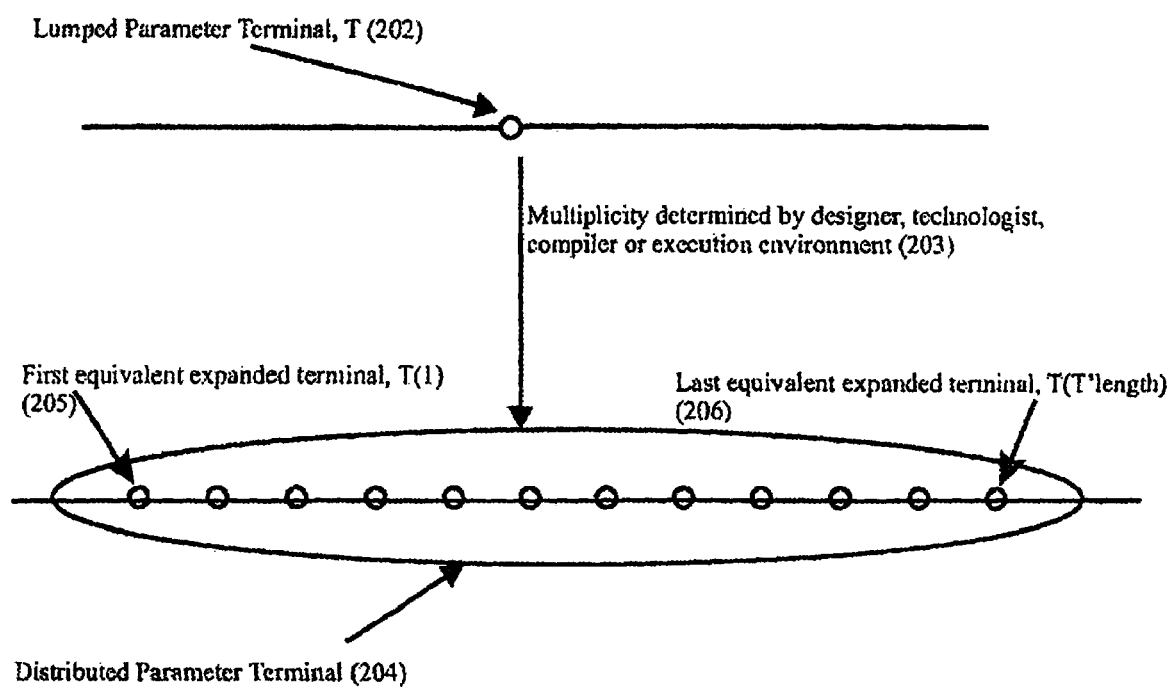
FIG. 3 illustrates that lumped parameter terminals may be incrementally expanded into distributed parameter representations of the same terminals to reflect requirements for greater behavioral detail.

In lumped parameter modeling languages, terminals denote a point at which contributions from two or more branches converge, such as the lumped parameter terminal (202) at the top of FIG. 3. Analogous to the introduction of resolution functions to associate a procedural code fragment with the technology implementing an interconnect (modeled as a terminal), the preferred embodiment allows a technologist to encapsulate a more detailed interconnect model (consisting of quantities and equation systems) as an implementation of the interconnect behavior.

By encapsulating the expanded interconnect behavior, technologists may replace the lumped parameter with an implied array of terminals (such as a transmission line) or a finite element lattice which can ultimately serve as the data structure for finite element implementation of a full-wave model (such as the model parasitic coupling within an electronics package or even an antenna acting as an element within a larger system model). FIG. 3 shows a comparatively simple expansion from a single terminal to an array of implied terminals. Connections made by the designer to the original terminal (202) may either be associated by default (as with resolution functions) or by explicit reference to elements of the terminal array (such as 202 and 206). Those skilled in the art of hardware description language design will readily generalize from the implied terminal array (204) into a two or three dimensional lattice suitable for finite element implementation of a full-wave equation solver.

FIG. 4 illustrates the corresponding fragment within an extended VHDL-AMS syntax. Lines 210 and 211 declare a very conventional definition of current and voltage. Lines 212 and 213 define a comparatively conventional nature and unconstrained array of natures. Innovatively Line 214 defines a procedure (or equivalently this could be a Verilog task) implementing the behavior of a distributed transmission line. Innovatively this procedure may then be used in the formation of a distributed subnature analogous to the association of a function and subtype to implement a digital resolution function. The subnature may then serve as the nature of a terminal declaration, as in Line 219.

Parameters to a distribution function must be a terminal interface declaration of an unconstrained nature followed by zero or more interface declarations used to customize the distribution procedure's behavior for a specific terminal declaration. For example, the constant or variable interface declarations may represent a specific dielectric constant, characteristic impedance or even time-varying property such as the local temperature within the system model of a micro-electronic machine. Subsequent signal, shared variable or other terminal declarations may provide for modeling explicit induced noise or parasitic couplings.

Values may be associated with the distribution function's constant or variable parameters at the point where the nature is associated with a specific terminal declaration. For languages which allow terminals of unconstrained type, distribution function parameters and constraints must be syntactically distinguished. One means for distinguishing the distribution function parameters and constraints takes advantage of the need to provide a constraint for each unconstrained dimension of the nature at the point where the nature is associated with a terminal. Therefore the constraints, if any, may appear as a parenthetic list. Distribution parameter associations, if any, may then appear as a subsequent parenthetic list. Other means of synthactically denoting constraints and parameter values are possible and are commonly known to language designers.

Quantities then refer to terminals (and thus instances of distributed natures) to form branch quantities and thus characteristic, simultaneous or constraint equations representing the design's behavior. In the prior art, terminals are either scalars or composites ultimately defined in terms of scalars. Each scalar nature has an across and through type relative to an explicit or implied reference terminal. The reference terminal commonly represents a localized or global "ground".

In the previous case of a resolution function associated with a signal, the resolution function's input dimensionality is imposed external to the resolution function by the set of drivers immediately contributing to the resolved signal's value. As an innovative step, the terminal subnature's distribution function must internally impose a constraint on a specific, unconstrained parameter based on the terminal's immediate modeling requirements chosen by the technologist who created the distribution function. To the system designer using the terminal with a nature having a distribution function, the terminal appears to be a lumped parameter with all the modeling ease of use commonly associated with a lumped parameter model.

Internal to the distribution procedure body, the technologist controls the dynamic degree of distribution, the modeling mechanism and even the parasitic couplings not explicitly denoted by interface associations at the point where the distributed nature was associated with the terminal through definition of the procedure's body. This degree of flexibility cleanly and orthogonally separates language design from modeling methodology, facilitating the independent efforts of mixed-signal system designers, technologists and tool developers. This de-coupling results in a technology-independent language design with broad applicability and thus an implementation expense spread over many application domains. Therefore it is a useful innovation.

Those skilled in the art of mixed signal language design will recognize three complications to the implementation of this innovative step. First, some mechanism must be provided to dynamically constrain the distribution procedure's dimensionality. Second, some means must be provided to dynamically associate specific elements of the terminal parameter with external contributions to quantities. Third, some means must be provided so only the modeling detail actually required is embodied in the code executed to implement the distribution procedure body.

First, various methods for constraining dimensionality of the terminal interface declaration sub-nature on each call (and thus dynamic elaboration) of the distribution procedure are known to those skilled in the art and can be employed with approximately equal ease. Most methods involve introducing a step at the point during call to the distribution procedure when the interface declaration is first elaborated, at which time arbitrary code can be executed. An immediately relevant precedent for such elaboration is found in VHDL's type conversion functions, only in this case the function called when mapping from actual to formal parameters in the association constrains the terminal nature dimension rather than transforming the value. Syntactically this may be accomplished by methods such as allowing the 'length attribute to become an (assignable) right hand side value for VHDL. Comparable language extensions can readily be identified for other mixed signal languages, such as Verilog or Mast, by those skilled in the art.

Second, some mechanism must be provided to address the association between elements of the first terminal parameter to the distribution procedure and external quantities referencing the first terminal interface declaration. In this case VHDL's resolution functions are not of direct help. Indeterminate mapping between external signals and resolution function input elements for digital VHDL are one of the major sources of non-deterministic behavior within VHDL. Such non-determinism is generally recognized and somewhat reluctantly accepted as a compromise to achieve higher performance and language simplicity. One means of addressing both the digital resolution function parameter association problem and the more immediate need for association with the first parameter of a terminal declaration's distribution procedure is to make the unconstrained array explicit at points which refer to the terminal. For example, a terminal with a sub-nature having a distribution procedure could either be referenced with an indeterminate array type, in which case the association would be indeterminate, or via explicit array subscript expressions. For example, in the later case one end of a transmission line model might refer to terminal subscript zero whereas the opposite end would refer to terminal ' length. Other methods for making the association and extensions to language other than VHDL will be obvious to those skilled in the art of language design.

Figure 5:
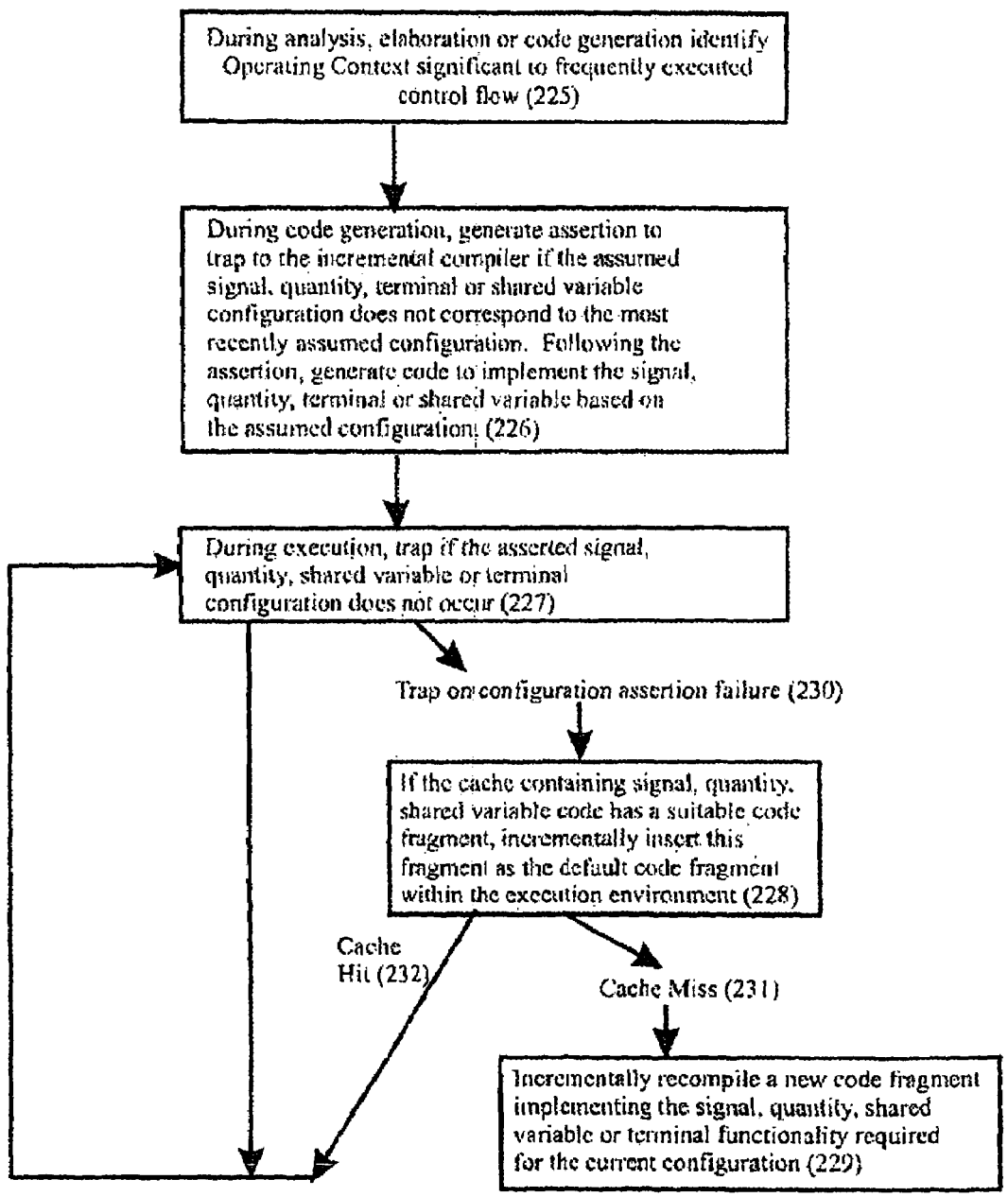
FIG. 5 illustrates that during simulation, implementation of resolution functions and distribution procedures may be incrementally recompiled to more efficiently reflect specific driving conditions, abstractions of physical properties, operating frequencies, external noise and other factors altering operation of the design.

This brings us back to the third concern for both the implementation of existing resolution functions and the innovative distribution procedures described above; performance inversely proportionate to the modeling detail required. The innovative method solving both concerns is shown in FIG. 5. During analysis and elaboration the compiler predicts the configuration in which each signal, quantity, terminal and shared variable is predicted to operate (225). Then during code generation, the code generator implicitly inserts assertion or trap functionality to involk the compiler if the assumed signal, quantity, terminal or shared variable configuration does not correspond to the most recently assumed configuration. Following this assertion, the compiler generates optimized code to implement the signal, quantity, terminal or shared variable based on the assumed configuration (226).

During simulation execution, general purpose processor instructions or configured logic (in an FPGA) result in a re-invocation of the compiler if the asserted signal, quantity, shared variable or terminal configuration does not actually occur (227). Iteratively the execution traps on the exception (230), potentially re-uses a cached implementation of an instruction sequence or configured logic matching the conditions actually occurring during a simulation and continues execution.

In the context of an innovative distributed terminal, the technologist may directly or indirectly include several implementations in the procedure representing interconnect functionality. If a quantity or variable rep-resenting frequency is below a threshold, the terminal may remain lumped. If the frequency exceeds the first threshold, the implementation may use a relatively coarse transmission line model. At still higher frequencies the procedure may use a full-wave model implemented using explicit finite element techniques. How-ever it is very important to note that our innovation simply supplies a very flexible and efficient method for a skilled technologist to implement many different kinds of condition-specific interconnect models; our innovation does not embody any specifics of device or interconnect technology and thus is extremely general and flexible. As with resolution functions, the innovation facilitates a decomposition of skill between the overall designer and the interconnect or device technologist.

Figure 6:
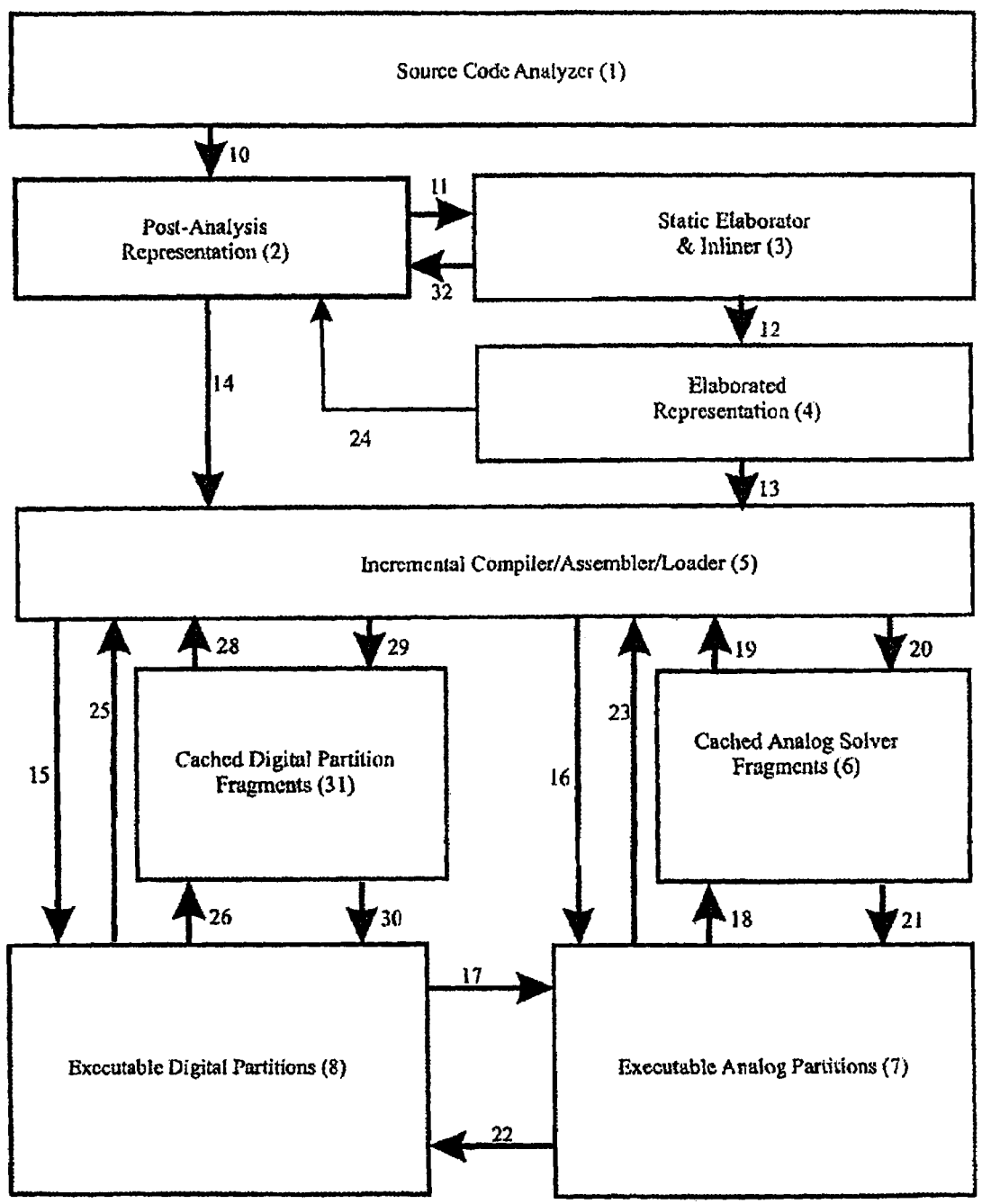
FIG. 6 illustrates the overall steps required for optimized simulation of a design using innovations taught herein.

FIG. 6 illustrates the overall software components within the preferred embodiment. Components 1 through 5 are processor instructions configuring the persistent storage system, memory and instruction cache(s) of a uniprocessor, shared memory multiprocessor or cluster of such processors (software). Components 6, 7, 8, and 31 may be implemented in software or electronically re-configurable logic devices (often known as FPGA).

The Source Code Analyzer (1) is a means of incrementally translating from graphical or textual models of a digital, analog or mixed signal design into a post-analysis representation (2). One common example of such an analyzer is FTL Systems' Tauri source code analyzer translating into FTL Systems' AIRE/CE Internal Intermediate Representation (IIR). The Post-Analysis Representation (2) supplies representation elements such as literals, identifiers, strings and declarations to both directly to the Incremental Compiler/Assembler/Loader (5) and to the Static Elaborator and Inliner (3).

At designer-defined events, known as Design Epochs, the Post-Analysis Representation (2) triggers (11) the Static Elaborator and Inliner (3) which subsets of the Post-Analysis Representation (2) have changed since the start of compilation or the last Design Epoch. The Static Elaborator and Inliner (3) then incrementally queries the Post-Analysis Representation (2) to generate or update Elaborated Representations (4) through application of rewriting rules defined by the modeling language(s) in use or by conventional compiler optimizations such as subprogram inlining, loop unrolling, constant propagation and related transformations.

The Elaborated Representation (4) consists of constructs denoting digital objects, digital partitions, analog objects, analog partitions and full-wave partitions along with back-annotations to the Post-Analysis Representation (2) and eventually textual source code. Back-annotations are used for interactions with the designer such as source level debug, profiling, timing annotation and related functions.

As changes to an Elaborated Model Representation (4) resulting from previous Design Epoch(s) are reflected in the Elaborated Representation (4), the Incremental Compiler/Assembler/Loader (5) may begin compilation into an executable form, ultimately resulting in Executable Digital Partitions (8) and/or Executable Analog Partitions (7). Compilation cycles by the Incremental Compiler/Assembler/Loader (5) may ultimately be triggered by the Designer (resulting from design changes or interactive debug/profiling) or by the executing digital and/or analog simulation. The latter trigger is an innovative step.

The Incremental Compiler/Assembler/Loader (5) includes the following compiler functionality:
  means of maintaining storage allocation for digital partitions, analog partitions, subprogram call stacks, stimuli, event traces and dynamically allocated storage
  means of maintaining and optimizing processor instructions synchronizing partitions, implementing digital partitions and implementing analog partitions,
  means of maintaining and optimizing re-configurable logic code synchronizing partitions, implementing digital partitions and implementing analog partitions
  means of loading assembly code and logic for execution While storage allocation, processor instruction generation, re-configurable logic generation and loading draw substantially from prior art in the compiler and synthesis literature, the present invention adds new and innovative mechanisms which enable analog, mixed-signal and full wave simulation as well as accelerating digital simulation.

Executable Digital Partitions (8), Executable Analog Partitions (9) or full-wave partitions (not shown) either use Embedded Scheduling techniques first taught by the present inventor in 1991 or an innovative generalization of these techniques to multiprocessor and re-configurable logic implementations. In essence, Embedded Scheduling combines processor instructions and re-configurable logic implementing models of design components with processor instructions and re-configurable logic implementing event transmission and execution scheduling.

Incremental compilation operations resulting in changes to Executable Digital Partitions (8), Executable Analog Partitions (7) or Executable Full-Wave Partitions (not shown) are often transient. Common examples of such changes include breakpoint insertion, callback insertion, optimization of digital resolution function implementations, linearizations of an equation system at an Operating Context and substitution of various interconnect components within an analog partition. Processor instruction sequences implement these changes by changing the target of instructions such as jump, conditional jump, branch, conditional branch, call and return or substituting an existing instruction by one of these jump, branch, call or return instructions. Re-configurable logic implements these changes by re-configuring one or more logic cells or altering interconnect configurations.

In order to accelerate restoration of previous instruction or logic functionality, previous instruction fragments or logic fragments may optionally be retained in a hardware or software cache. In order to accelerate fragment lookup and subsequent incorporation in an executable. Digital, analog and full-wave fragments may optionally-be cached in separate caches such as the Cached Digital Partition Fragments (31) or the Cached Analog Solver Fragments (6). Requests for potentially cached fragments may be routed directly to the compiler, as in paths (23/25), or optionally requests may be routed via the corresponding cache (18/26), flowing on to the compiler in the case of a cache miss (19/28). The compiler may in turn supply the incrementally compiled fragment directly to the executable (15/16) for immediate loading or optionally via the cache (20/21 or 29/30).

Figure 7:
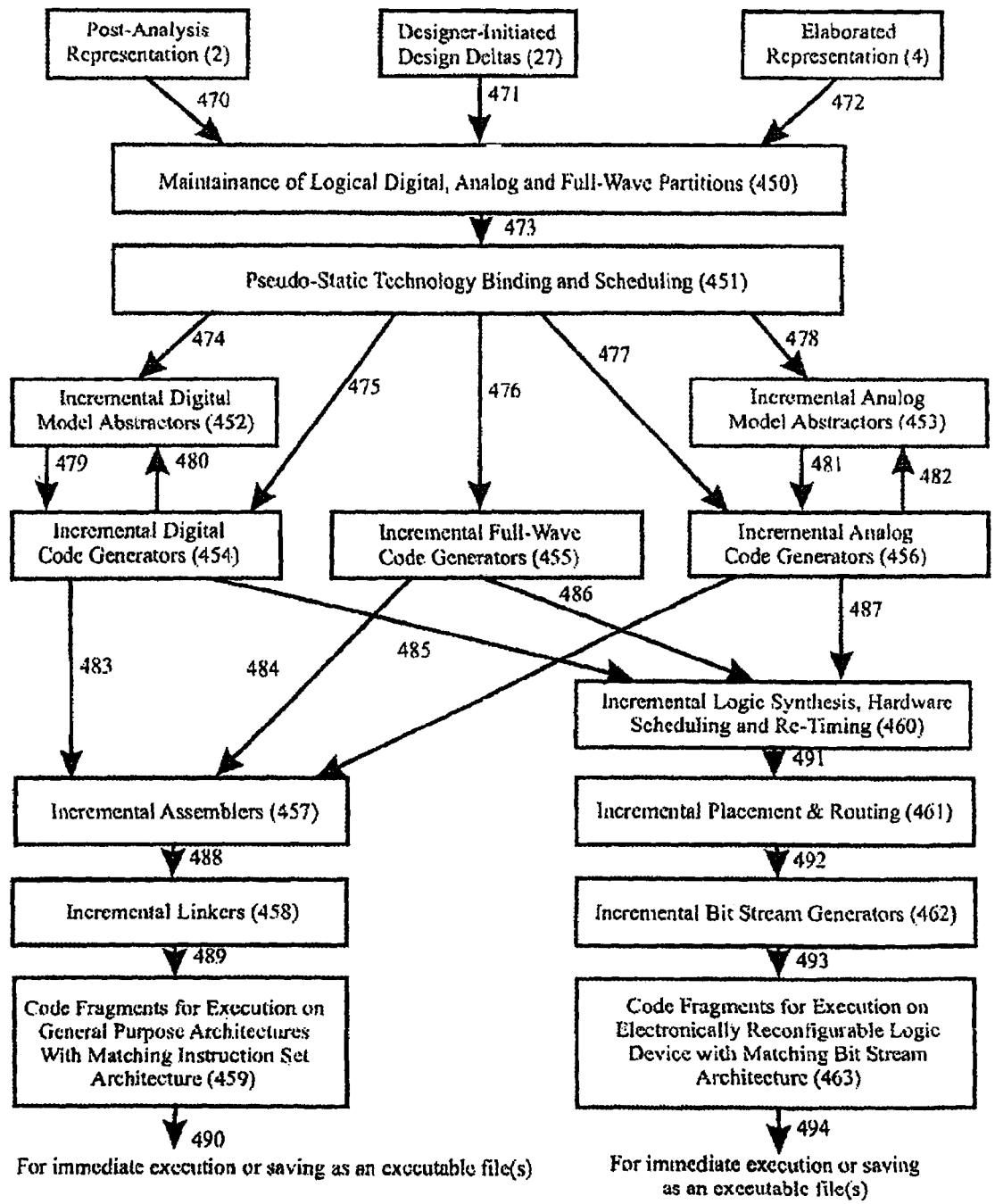
FIG. 7 illustrates the detail of incremental compilation and execution functionality for optimized simulation using innovations taught herein.

If the cache is involved in the path from compiler to executable, the relevant cache lookup process is shown in FIG. 7. Bit fields which define a partition's Operating Context from objects, their subtypes and sub-natures are extracted from the current object values to form a Cache Key (309). Bit fields which define a particular point within an Operating Context are not used in the key formation. The resulting key may be used directly for Cache Lookup (310) or indirectly by computing an additional Hash function (311). Due to the large number of bits often involved in a key, some means of lookup acceleration, such as a hash, is often a practical requirement. Lookup then uses both the key (310) and its hash (312) for lookup. A wide variety of techniques for computing hash functions and implementing a cache lookup are known to those skilled in the art.

Figure 8:
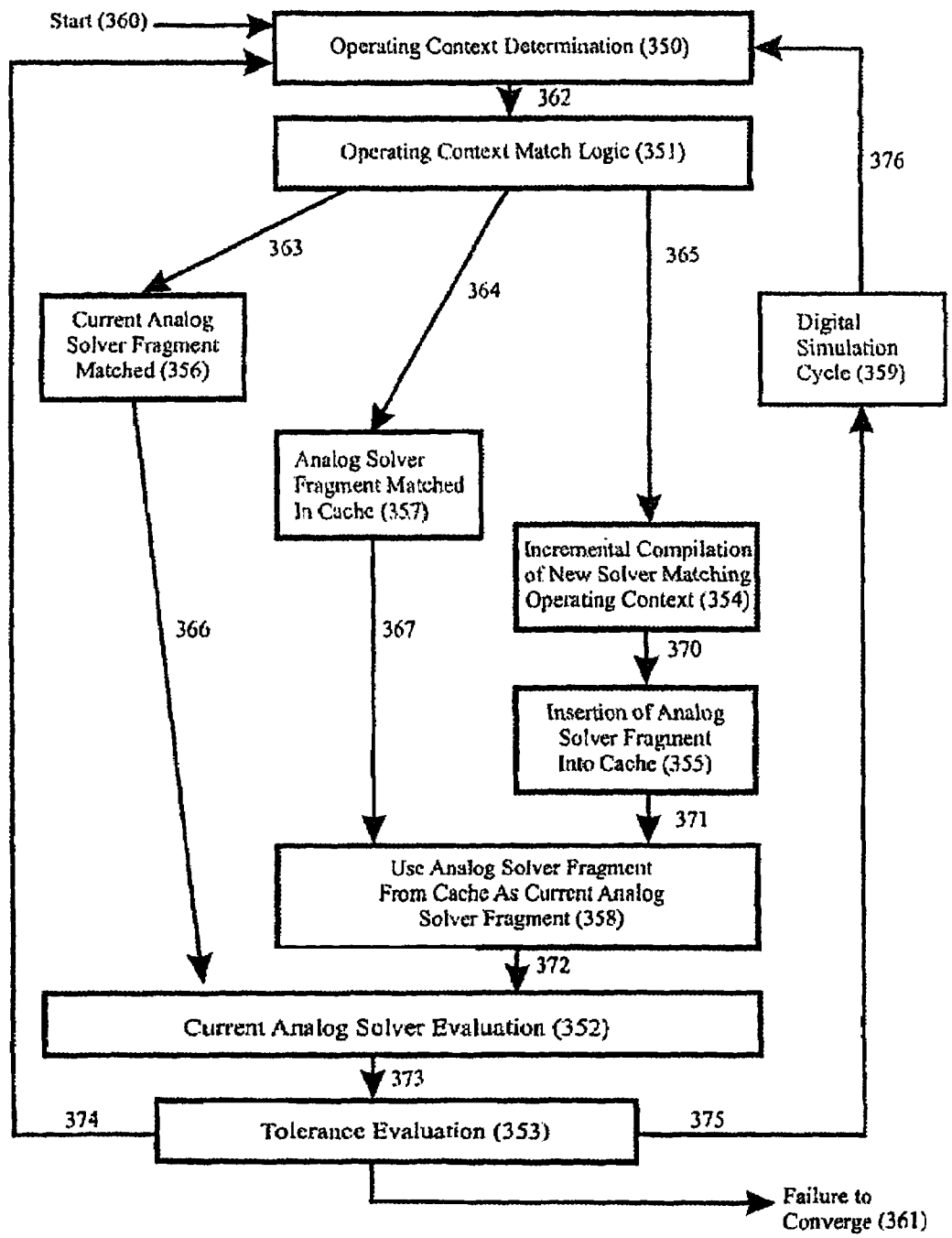
FIG. 8 illustrates the modification of simulation cycle implementation to accommodate optimization.

The analog solver simulation cycle is shown in FIG. 8. Conceptually the same sequence of steps occurs when executing using a sequence of instructions or re-configurable logic; the primary differences are in the implementation of Incremental Compilation (354) and Evaluation (352). At start (360) the compiler loads initial values, instructions and re-configurable logic configurations. Depending on a partition's executable implementation, instructions or logic implement a means of Operating Context Determination (as discussed above in the context of FIG. 7).

Using well-known software or hardware caching techniques, Operating Context Match Logic (351) deter-mines if an existing instruction sequence or logic configuration is already available to implement the partition's behavior in the partition's current operating context. The Operating Context Match Logic (351) will produce one of three outcomes: the partition's current instruction sequence or logic configuration, is a suit-able implementation of the partition's behavior in the operating context (363 leading to 356), a suitable implementation is available in the cache (364 leading to 357) or a suitable instruction sequence must be compiled (365 leading to 354), loaded into the cache (370 leading to 355) and loaded for execution (371 leading to 358).

Once a current analog solver is loaded to implement each analog partition behavior at its Operating Context (352), the analog solver executes to identify new values to associated with analog objects. In the case of an analog partition's solver, the solver updates quantity values, evaluates left and right hand sides of each com-piled equation and compares the difference against the acceptable tolerance defined by the applicable language reference manual (353). If all compiled equations in the analog partition are less than a tolerance away from equality, the Digital Simulation Cycle (359) runs with an implementation comparable to the one shown in FIG. 8, otherwise the updated quantity values lead to a new Operating Context Determination (374 leading to 350) and the analog solver cycle begins again.

A wide variety of numerical techniques for evaluating an analog solver are documented in the literature and well known to those skilled in the art (such as Newton-Raphson iteration). Virtually any of these techniques can be applied to the innovative approach taught here. However by using an instruction sequence or logic configuration which implements an analog solver specific for an Operating Context, linearizing within this context and then generating instructions or logic it is possible to innovatively avoid the need to either use a large but sparse matrix or employ interpretation techniques for traversing a sparse matrix data structure. Since the exact set of operators required and their data dependencies are known at the time code is compiled, all of the operations may be efficiently, pseudo-statically scheduled on multiple processors and/or re-configurable logic and immediate offsets into the memory layout may be incorporated directly in instructions or logic.

Figure 9:
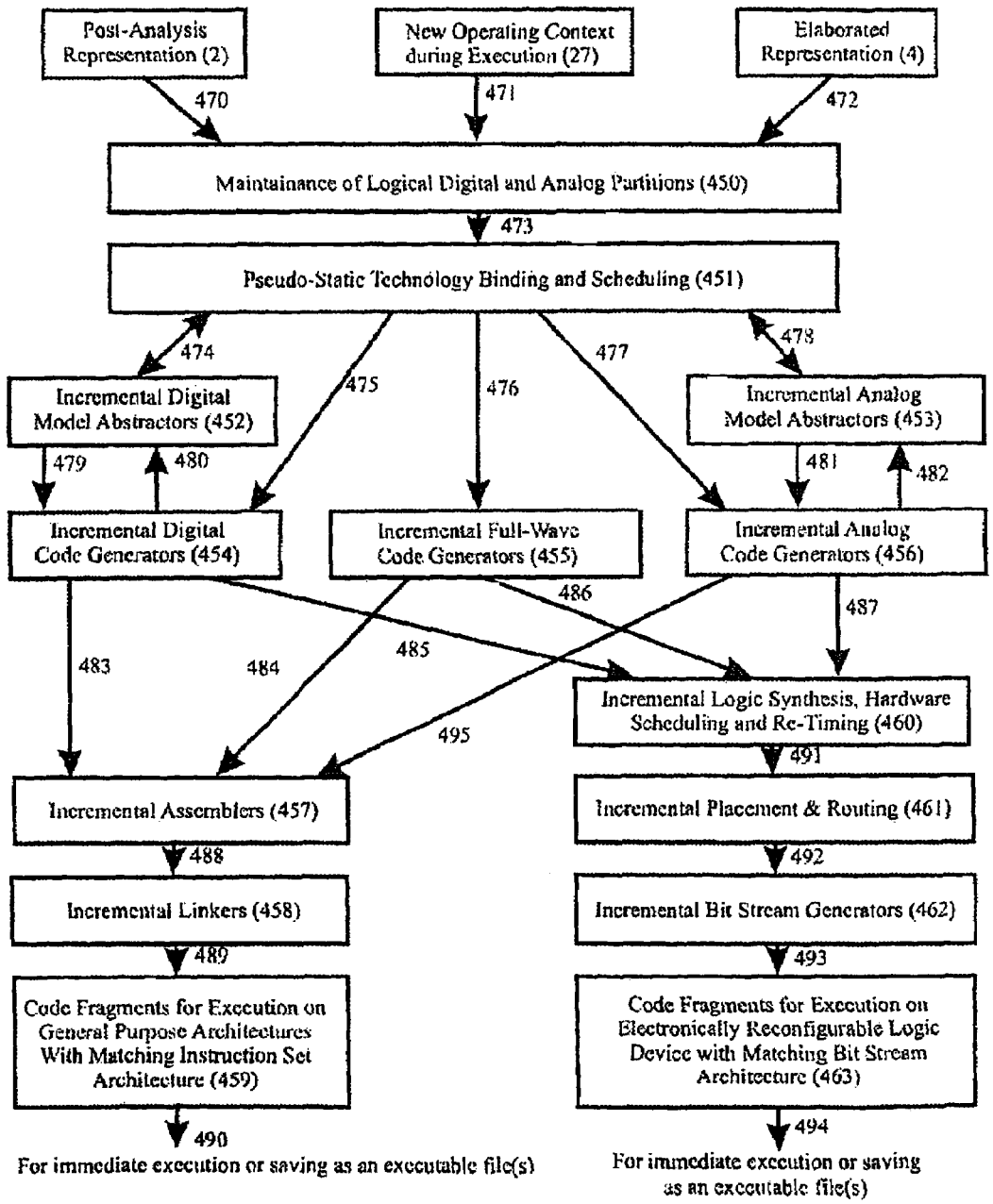
FIG. 9 illustrates the detail of operating point key generation within analog solver cache.

FIG. 9 details the means of Incremental Compilation (used at step 354 in FIG. 8 or the equivalent step during the digital simulation cycle (359)). Post-Analysis Design Representations (2), changes in a partition's Operating Context (27) and Design Epochs in the Elaborated Representation (4) all result updates maintaining a revised logical view of digital or analog partitions. Such partitions are logical in the sense that compilation may further schedule the partition for execution on multiple processors and/or logic devices or multiple logical partitions may be combined on a single processor or re-configurable logic device using Embedded Scheduling.

A distinct compilation phase, Pseudo-Static Technology Binding and Scheduling (451) maps logical partitions onto specific processor and/or re-configurable logic devices. For each logical partition, the technology binding and scheduling step estimates the processor resources (clock cycles and number of processors) and logic resources (number of logic blocks and interconnects) required to implement the logical partition. Then using well-known techniques for static scheduling, this step determines which implementations and bind-ings to specific execution hardware are most efficient in reducing the partition's execution time. Subsequent compilation steps use this schedule to choose a subsequent implementation technology (474, 475, 476, 477 and 478).

Three different code generators respond directly to specific kinds of bindings to generate digital (454), analog (456) and full-wave (455) instruction sequences or logic/interconnect configurations. Alternatively either scheduled digital or analog partitions may be identified as candidates for simplification using model abstractors (452 and 453). Model abstractors which can successfully implement an abstraction generate a revised resource estimate (474) which may in turn impact a more generate technology binding and scheduling (475, 476, 477).

Model Abstractors replace operators, data types and components within a design with a simpler form expected to have observably equivalent behavior based on expected use. If use expectations differ from actual use during simulation, the equivalent model must be transparently replaced (via re-compilation) and the more complex implementation restored. For example, adder logic using a multi-valued logic system may be abstracted into a processor's add instruction using a two-value logic system based on the (validated) expectation that only zero and one values occur and that the adder logic is correct. A comparable analog model abstractor might replace an amplifier circuit with an equivalent behavioral model.

Digital (454), analog (456) and full-wave (455) code generators create an intermediate representation which is exported to a sequence of back-end code generation steps for an instruction set sequence (483, 484, 495), re-configurable logic (485, 486, 487) or both. Generators may emit an intermediate format such as C, EDIF or XDL suitable for an external compilation or sythesis step. Such external steps attain an equivalent end result, generally with substantially higher compilation latency.

The incremental assembly step consists of an Incremental Assemblers (457), Incremental Linker (458) and Incremental Loader (459). The Incremental Assembler (457) may convert intermediate representations (483, 484, 495) to binary on an expression, subprogram, partition or other granularity. The resulting code fragments may be immediately used for execution, cached or stored in a file for subsequent use. Such back-end code generation steps (457, 458, 459) resemble many of the steps used by an integrated compiler back-end, such as the one produced by Green Hills.

The incremental synthesis path (460, 461, 462, 463) in a like fashion resembles an incremental version of a conventional behavioral synthesis process. Such a process includes logic synthesis, hardware scheduling (so as to reuse the same hardware for several instances of the operator in the model source representation), re-timing (to insure that hardware cycle, setup, hold and related timings are actually met with the logic's target technology, partition and timings), placement of logic onto specific re-configurable logic devices, re-config-urable logic cells, routing between cells and devices, bit stream generation for configuring each devices and loading for immediate execution, caching, or storage in a file for subsequent use.

Figure 10:
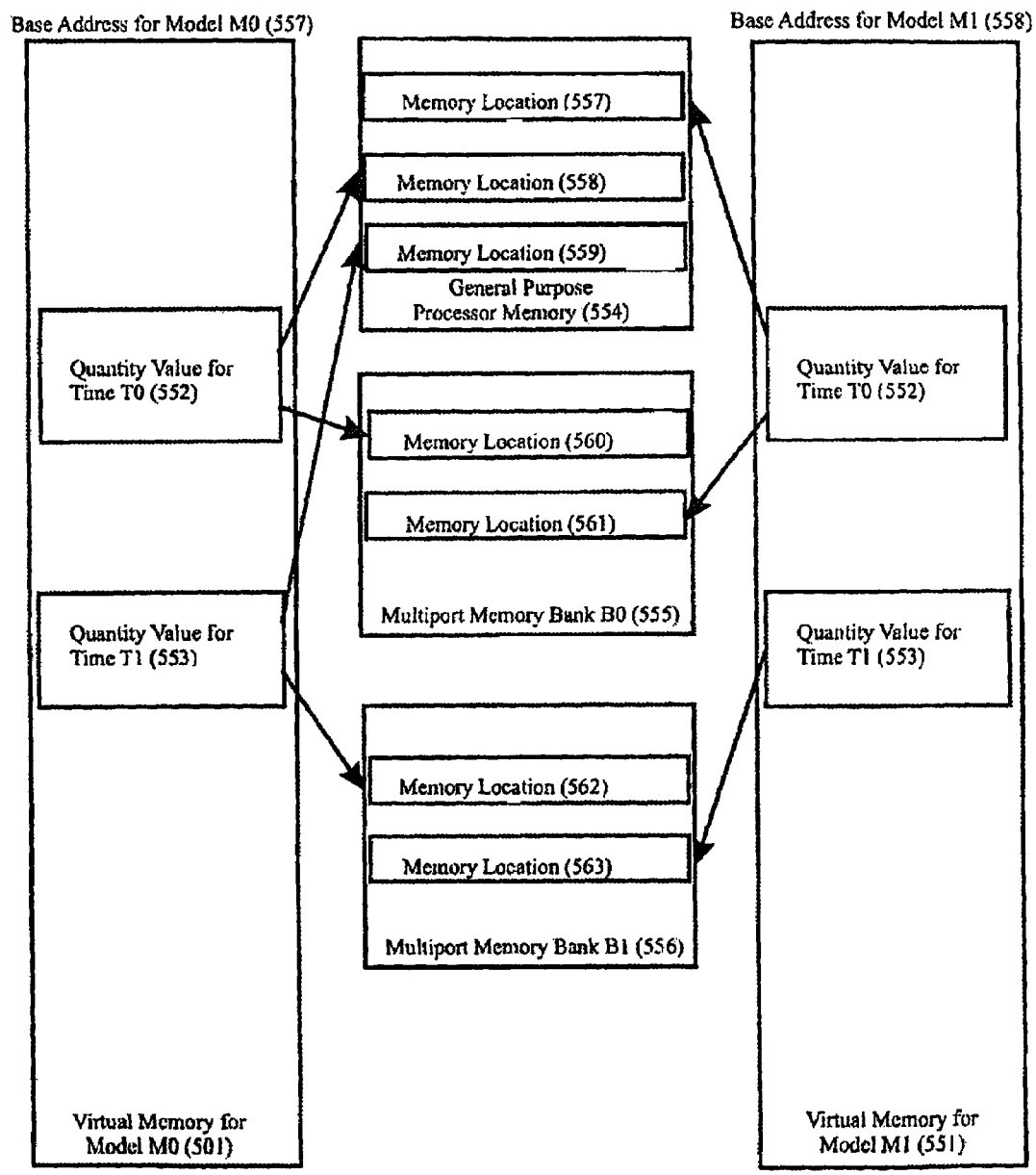
FIG. 10 illustrates the management and allocation of simulation state.

Technology Binding and Scheduling (451) not only maps execution to instructions and logic, it also maps objects as well as implicit storage (such as temporaries, events and other data) into one or more memories, as shown in FIG. 10. When objects are common to two or more physical partitions (for example when partitioning divides a logical partition between two re-configurable logic devices or between a re-configurable logic device and general purpose processor such as 552), storage allocation must bind the object two or more locations (only one of which is generally read/write at a specific instant in simulation time). Furthermore since memory is more efficiently copied as a large block, storage may be allocated to objects using bins which provide for block memory copies from the read/write version of one or more objects to the other, read-only copies. As the optimal layout changes over time, either memory overlays or other techniques may be adapted to minimize the time required for memory to memory copy operations.

The same processors and re-configurable logic may be used to execute more than one compiled model. For example, to accomplish fault simulation a primary model may be spawned into two or more models with specific faults. Alternatively, an abstracted model (resulting from 452 or 453) may be simulated in parallel with the original component to explore equivalence of the two models.

It is understood that analog solvers for two or more Operating Contexts may be combined into a single logic configuration, potentially with parameterization, at the potential expense of performance or capacity reduction. Techniques for such hardware scheduling are already well-known from the synthesis literature.

Figure 11:
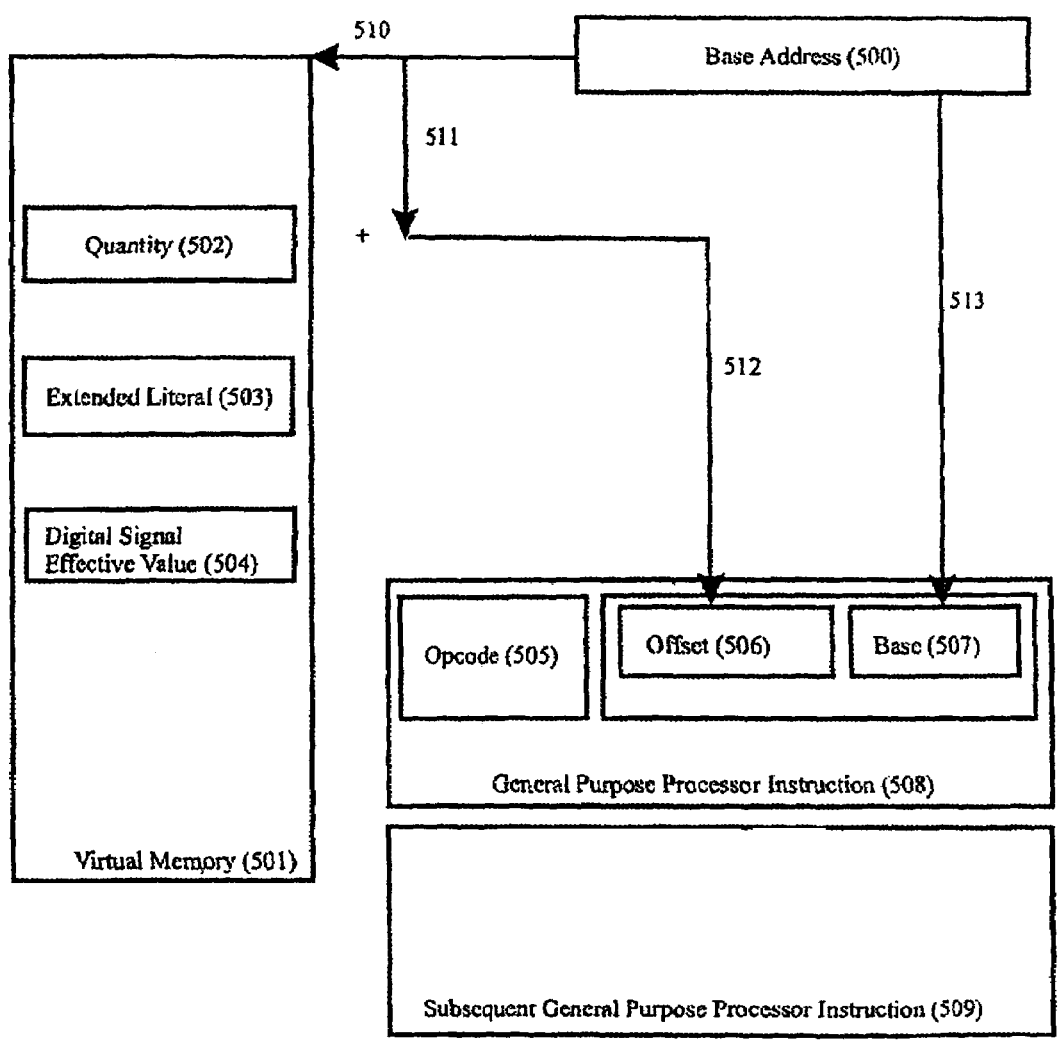
FIG. 11 illustrations the direct simulation state reference from addressing fields of machine instruction.

As a result of linearizing equation systems around an Operating Context prior to code generation or synthesis, addressing of operands by processors or re-configurable logic is substantially simplified, as shown in FIG. 11. For clusters of one or more memory arrays, a base address may be assigned (500) from which operands of interest may be referenced (such as Quantity 502, Extended Literal 503 or Digital Signal Effective Value 504). A processor or logic may then reference the required object value by adding a known or computed offset to the base address (511), allowing a single instruction to generate an effective address needed to reference an operand (508). Reference patterns for declaratively nested subprograms and objects where the subtype constraints are dynamically elaborated are only slightly more complex. Techniques for handling these and related reference patterns are well known to those skilled in the art of compiler backends or behavioral synthesis.

Figure 12:
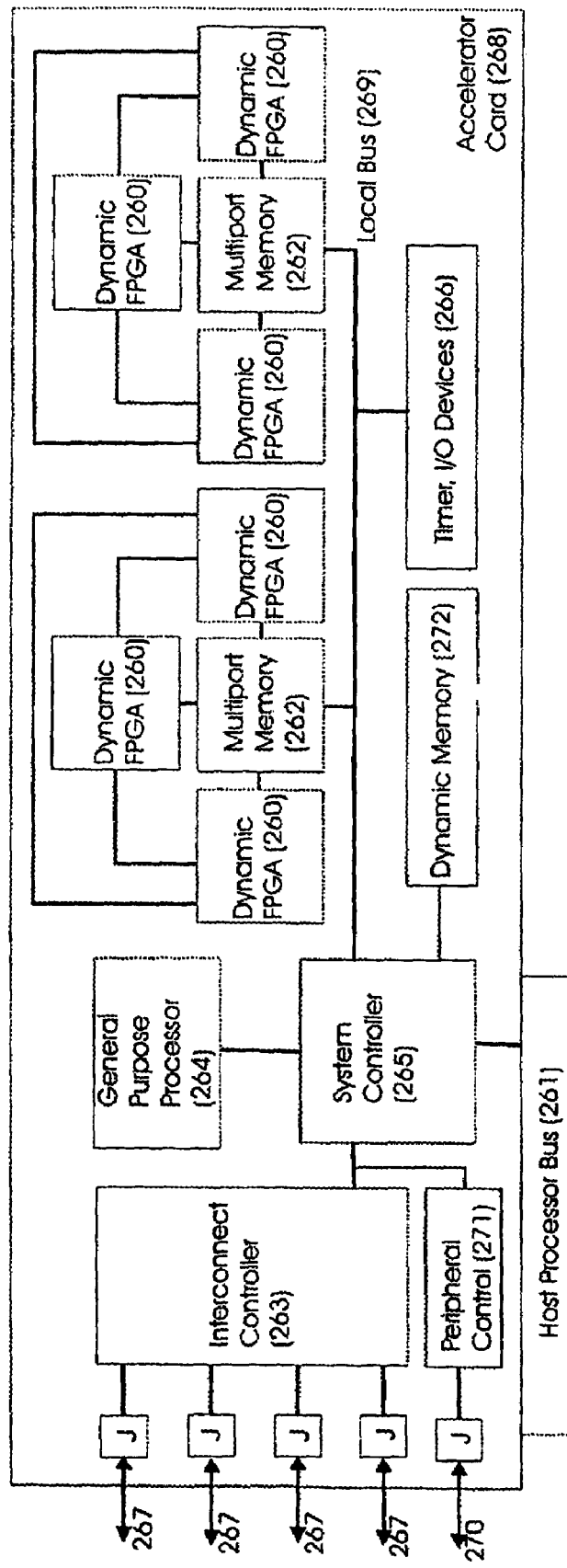
FIG. 12 illustrates the logical architecture of a single simulation accelerator card

FIG. 12 shows the preferred embodiment of an innovative apparatus used to compile and simulate digital, analog, mixed-signal and/or full-wave models of a design. This card fits into an apparatus previously disclosed in U.S. Pat. No. 5,999,734. Jacks marked 267 may be used to connect with other such cards using a switch, ring or other direct connection technology familiar to those skilled in the art of such designs. In a like fashion the Host Processor Bus (261), such as a PCI interconnect, may be used to access processors, accelerators, network and interconnect adapters, file systems and memory using device drivers or direct access via techniques common to those skill in implementing such interfaces. The following will then focus on explaining one such Accelerator Card (268) with the understanding that such discussion generalizes to apparatus where more than one such card is found on the same Host Processor Bus (261) or via interconnects in a cluster (267).

The switching controller (265) allows either other cards attached to the Host Processor Bus (261), one or more General Purpose Processors (267) present on the card or devices attached to the interconnect fabric (267) to access local Dynamic Memory (272), one or more Multiport Memory (262), other devices connected to the Host Processor Bus (261), other Accelerator Cards (268) attached via the Interconnect (267) or a Peripheral Bus (270). The Interconnect Controller (263) and Peripheral Control (271) respectively implement transmission and reception protocol for their respective Interconnects (267 and 270). Timers and I/O devices (266) support operating systems or real-time executives executing on one or more General Purpose Processors (264).

Each Multiport Memory (262) stores compiled logic configurations implementing executables for specific Models, Operating Configurations and partitions as well as object values and other temporary storage. Electronically Re-configurable Devices (FPGA) attached to the Multiport Memory support logic re-configuration for various models, partitions and Operating Contexts. Direct connections represent the change (delta) in quantity or signal values using encodings such as those shown in FIG. 16. One or more Multiport Memory banks (262) with one or more associated FPGA devices may be located on each card. Furthermore the Multiport Memory (262) banks may be comprised of one or more device in order to achieve the desired width and depth. Direct connections representing the change in quantity or signal values may be made among FPGA devices connected to distinct Multiport Memory (262).

The Peripheral Interconnect, accessible via the Peripheral Controller (271), supports the attachment of component models with encapsulated simulation model(s) (for example, comparable to the Multiport Memory (262) contained directly on the Accelerator Card). For example, this interconnect and controller might follow the Universal Serial Bus or Firewire (IEEE 1394) protocols.

Figure 13:
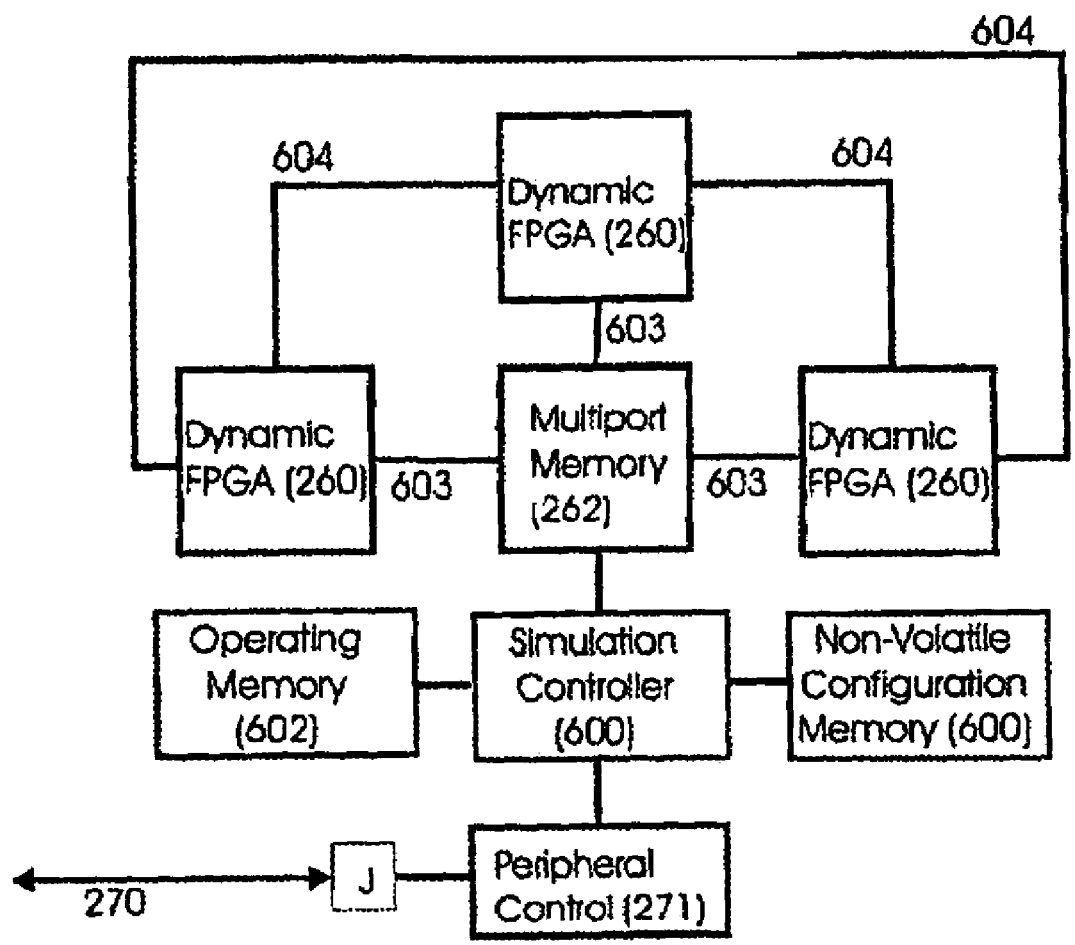
FIG. 13 illustrates the peripheral for insertion of one or more embedded component models into simulation.

One such encapsulated simulation model for attachment via the Peripheral Interconnect (270) is shown in FIG. 13. The Simulation Controller (600) provides some means of supplying simulation data and retrieving simulation data from the Multiport Memory (262). Operation of the Multiport Memory (262) and FPGA devices (260) closely follows such models running on the Accelerator Card. Since operations on the Peripheral Interconnect (270) do not allow retrieving a compiled model from the apparatus shown in FIG. 13, the implementation of models contained within the Non-Volatile Configuration Memory (600) or burned onto FPGA devices is as secure as the device package. The package may be encapsulated so as to erase the model configuration data if the encapsulation is physical interrupted.

In order to avoid the need for incremental compilation, models contained within the encapsulated simulation peripheral shown in FIG. 13 must have suitable logic configurations compiled for any supported Operating Context and contained within either the Non-Volatile Configuration Memory (600) or retained in the FPGA (260). Comparable techniques pre-generating logic for all supported Operating Contexts may be used for FPGA devices on the accelerator card at the expense of substantial pre-simulation compilation time and usage of persistent storage capacity.

Figure 14:
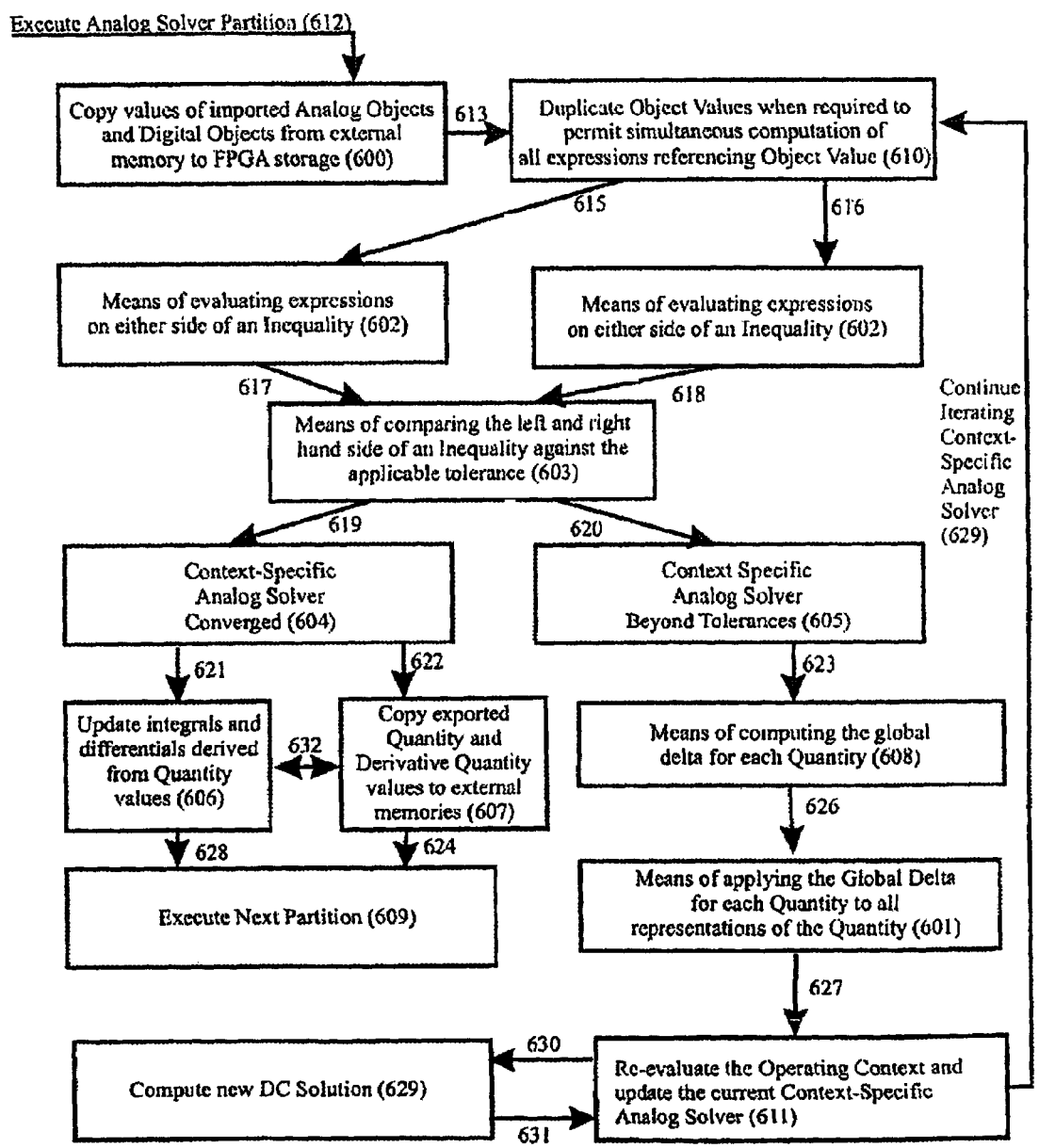
FIG. 14 illustrates the analog solver mapping directly onto electronically re-configurable logic array.

FIG. 14 illustrates the operating mode executing simulation of an analog partition using the apparatus shown on FIG. 12. Execution starts with 612, copying changes in the value of digital and analog objects which are altered outside of the partition and read by one or more equations mapped onto the current FPGA (260). Registers and/or memory arrays retain the current value of all objects (analog and digital) referenced or assigned by the current partition (610).

One or more means of evaluating expressions on either side of a characteristic equation must be provided on the FPGA device (602). Behavioral synthesis techniques for compiling expressions into such logic are well known to those skilled in the art of behavioral synthesis. In order to fit at least one characteristic equation from an equation system onto each FPGA, serial implementations of operators may be required. Such serial implementations for both floating point and integer representations are well-known to those skilled in the art of logic design. Furthermore, the same expression evaluation logic may be used for more than one characteristic equation evaluation using well-known hardware scheduling techniques.

When the left and right hand side of each characteristic equation has been evaluated, the value of the left and right hand side must be compared (such as by subtraction) and the magnitude of the result compared against the applicable tolerance (typically represented as a literal in storage or embedded in logic configurations). If the magnitude difference between left and right hand sides is less than the tolerance for all equations in the partition, the current object values result in analog solver convergence for the current cycle (604) and partition. Conversely, if the result is greater than the tolerance (605), the analog solver will continue iterating (623).

For each quantity, consider the set of all characteristic equation expressions referencing the quantity. For each such reference, some means of computing a delta change in the quantity value must be chosen to tend toward convergence with minimal overshooting. One such means is to combine the sign of the characteristic equation inequality, the magnitude of the left and right hand side difference, the slope (dependence) of the expression on the quantity (simplified by the implied linearization) and sensitivity of the expression to the quantity to arrive at a delta change in the quantity value implied by the expression. Other means with functionally comparable result will be evident to someone skilled in the art of numerical analysis.

Each quantity referenced on other FPGA devices must have a partial delta exported from each FPGA referencing the quantity to all other FPGA devices using the quantity resulting in a global delta (608) for each quantity on each cycle of the analog solver. If the quantity is used more than once on the same FPGA, the delta values may be combined with appropriately higher weighting when the delta is subsequently exported (609). Delta values are then imported (609) and combined to yield a composite delta value for each quantity on each cycle of the analog solver. This delta value is either separately combined on each FPGA using a quantity or exported and re-imported depending on the static availability of time-slots on FPGA pins to encode the delta. Delta values then generate a control signal for each means of up/down changes to the quantity values (601).

After quantities have been globally and consistently updated (601), the Analog Solver re-evaluates (611) the Operating Context associated with the quantity values resulting from Step 601. This re-evaluation was previously described using FIG. 8. Re-evaluation (611) comprises the constituent Steps 350, 351, 356, 357, 354, 355 and 358. Following re-evaluation the analog solver may continue with another iteration of the FPGA-based analog solver (629) or may complete the current-analog solver using a software analog solver (629) via some means of initiating software intervention such as a trap. Trap to the software-based solver specifically results from the need to converge over a wider capture range than the hardware provides, resulting from a discontinuity in quantity values or a failure to converge after a specified number of cycles through path 629. When the software-based analog solver completes it continues with execution of the Digital Simulation Cycle (609).

When the FPGA-based analog solver converges (604), any integral or differentials derived from quantity values must be updated (606). Concurrently any quantity or derived quantity values must be copied (607) from the FPGA (260) to Multiport Memory (262). As copying of the required quantity and derived quantity values completes, the interleaved digital simulation cycle may begin (628). As the new digital values result from the simulation cycle, the analog solver cycle may begin again (614) until reaching an implied or explicit breakpoint in time or other values.

Figure 15:
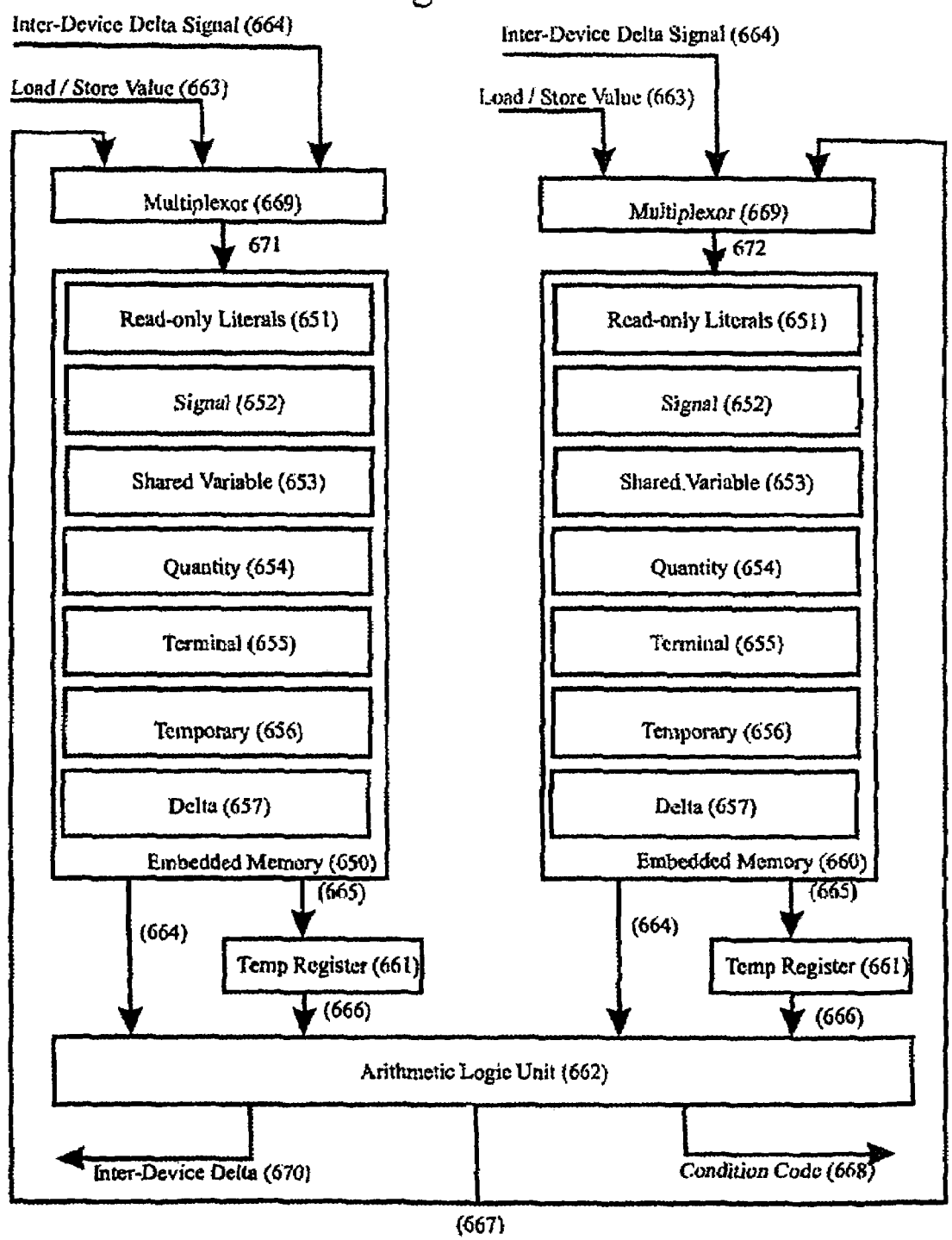
FIG. 15 illustrates the analog solver mapping directly into electronically re-configurable logic array with embedded memory.

Ideally all quantity values in the FPGA would be mapped directly to up/down counters. In order to simulate models for larger designs than could be directly implemented in counter logic, FIG. 15 shows how both explicit and implicit objects required for simulation of the partition may be partially or totally mapped into memory arrays (650 and 660) associated with the FPGA. The FPGA may contain the memory arrays internally or the memory arrays may be external. Objects contained in the arrays may include Read-only Literals such as tolerance values (651), Signal values (652), Shared Variables (653), Quantities (654), Terminals (655), Temporaries (656) and local or global Delta values (657). Even internal to an FPGA, multiple memory arrays are common and may be used for parallel evaluation of Equation System Expressions (602), expression comparisons (603), Delta values (601 and 608) and computing the Operating Context (611). Many variations on the register and arithmetic logic unit shown in FIG. 15 will be evident to those skilled in the art of processor design.

Pins used to interconnect logic internal to an FPGA (260) with logic external to the FPGA, such as another FPGA (260) or Multiport Memory (262) were previously used to represent signal values directly or using Time Division Multiplexing (TDM) to implement a digital simulation. Particularly in the context of analog simulation, mixed simulation or full-wave simulation (but also for digital simulation), representation of signals on pins (and associated interconnects) makes inefficient use of scarce pin and interconnect resources since some bits of the value (typically the more significant bits) change infrequently compared to the least significant bits.

Figure 16:
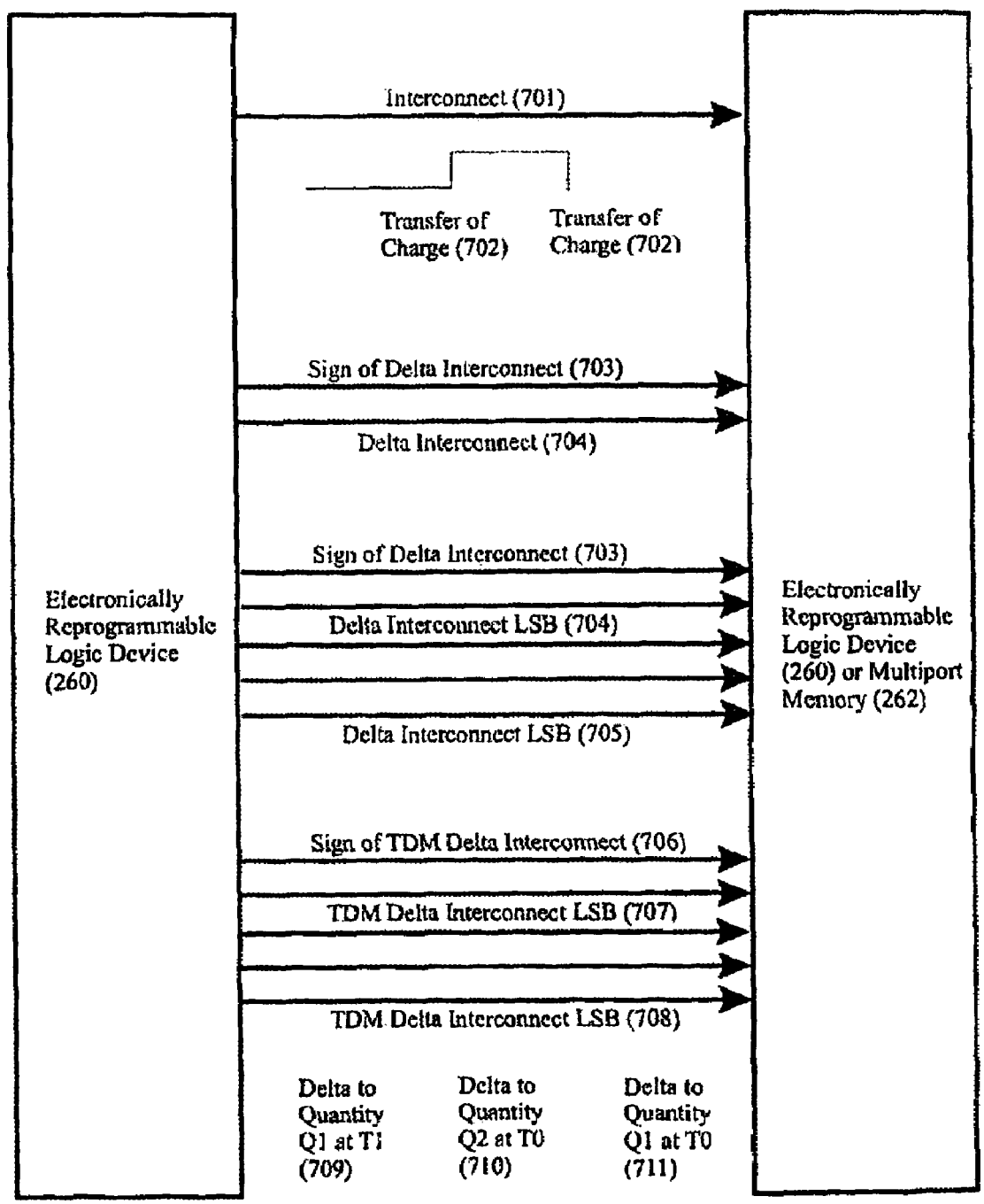
FIG. 16 illustrates the digital mapping directly onto electronically re-configurable logic array using delta representation of signals interfacing with another electronically re-configurable logic array.

FIG. 16 shows an improved, delta-based representation using pins and interconnects to represent the change in object value. A bit-wide interconnect may use both edges to represent transfer of a unit defined at compile time, such as a fixed number of charge or energy units (701). Such representation is exceptionally compact and makes efficient use of the power required during simulation to charge pins and interconnects. This representation is especially efficient for full-wave and high-frequency analog simulation. In general deltas consist of a sign (such as 703) and one or more bits of value (one bit shown at 704, a range of bits shown as 704 to 705). Furthermore, the several delta representations may be time-multiplexed on the same pins and interconnect using either synchronous time division multiplexing (the same delta appears at regular intervals on the pins and interconnect) or may append an additional field to transmit a specific delta value on demand (where the field indicates which delta value is on the pins and wires on a given cycle).

Figure 17:
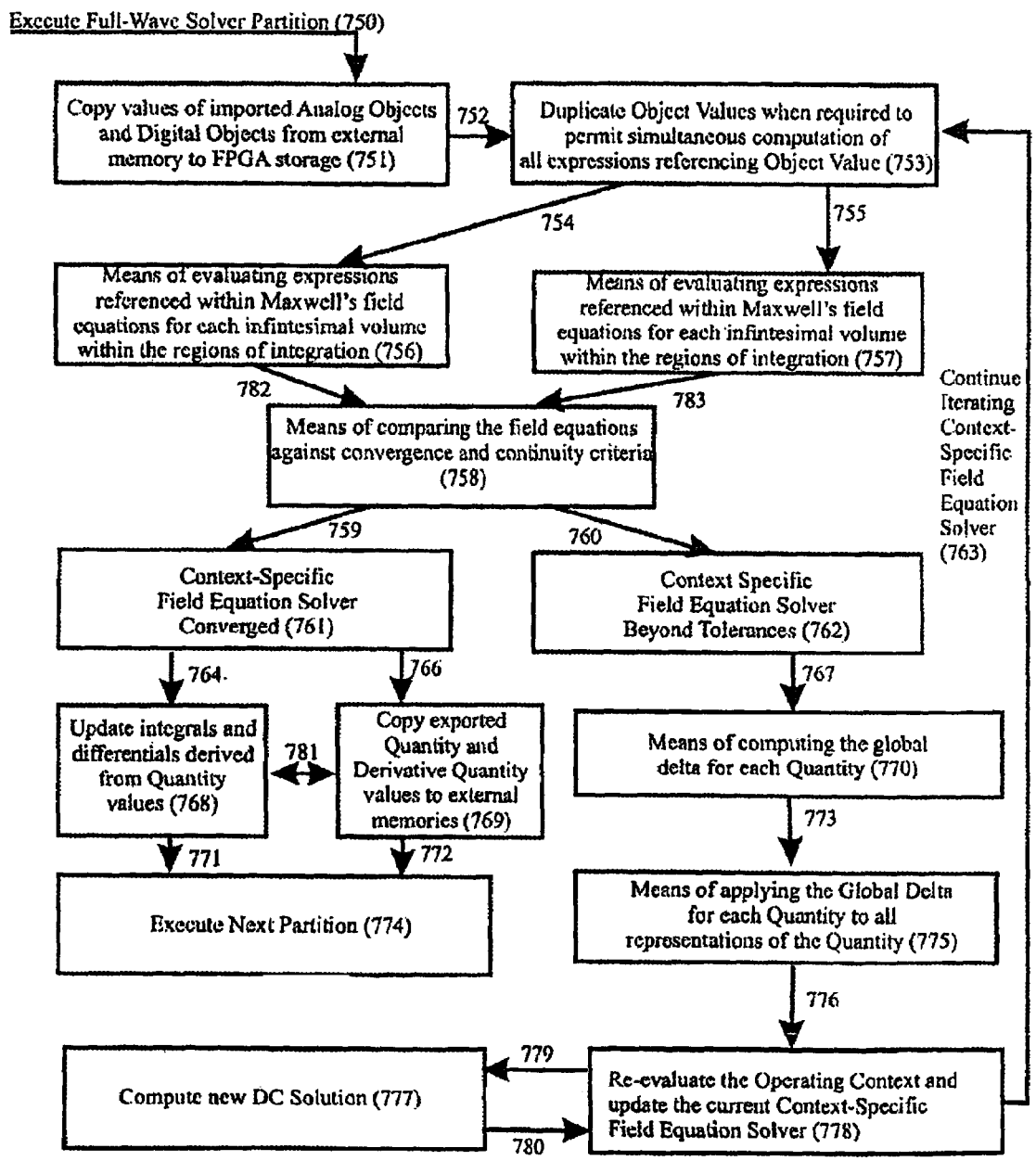
FIG. 17 illustrates the full wave solver mapping directly onto electronically re-configurable logic array using delta representation of value propagation with another electronically re-configurable logic array.

Implementation of the full-wave solver in FIG. 17 closely tracks implementation of the analog and mixed-signal solver in FIG. 14. Quantities implement elemental electrical and magnetic field intensity. Expressions reflecting finite element implementations of Maxwell's equations (and continuity) replace expressions implementing the left and right hand side of equation system inequalities. Continuity comparisons and delta computations closely track the analog and mixed-signal equivalent. Whereas there are many formulations of a full-wave field solver evident to those skilled in the art, the close correspondence with analog and mixed signal solvers both facilitates integration and facilitates integration of digital, analog, mixed-signal and full-wave simulation into an effective composite simulation. The closely related implementations also facilitate optimizations to solve common problems, such as concerns of numerical representation accuracy.

Analog, mixed-signal and full-wave simulation, like many iterative numerical problems, require representation of object values with substantial range and precision in order to maintain accuracy and minimize the impact of representation or arithmetic errors accumulating. Comparable challenges arise in control loops and signal processing applications.

Figure 18:
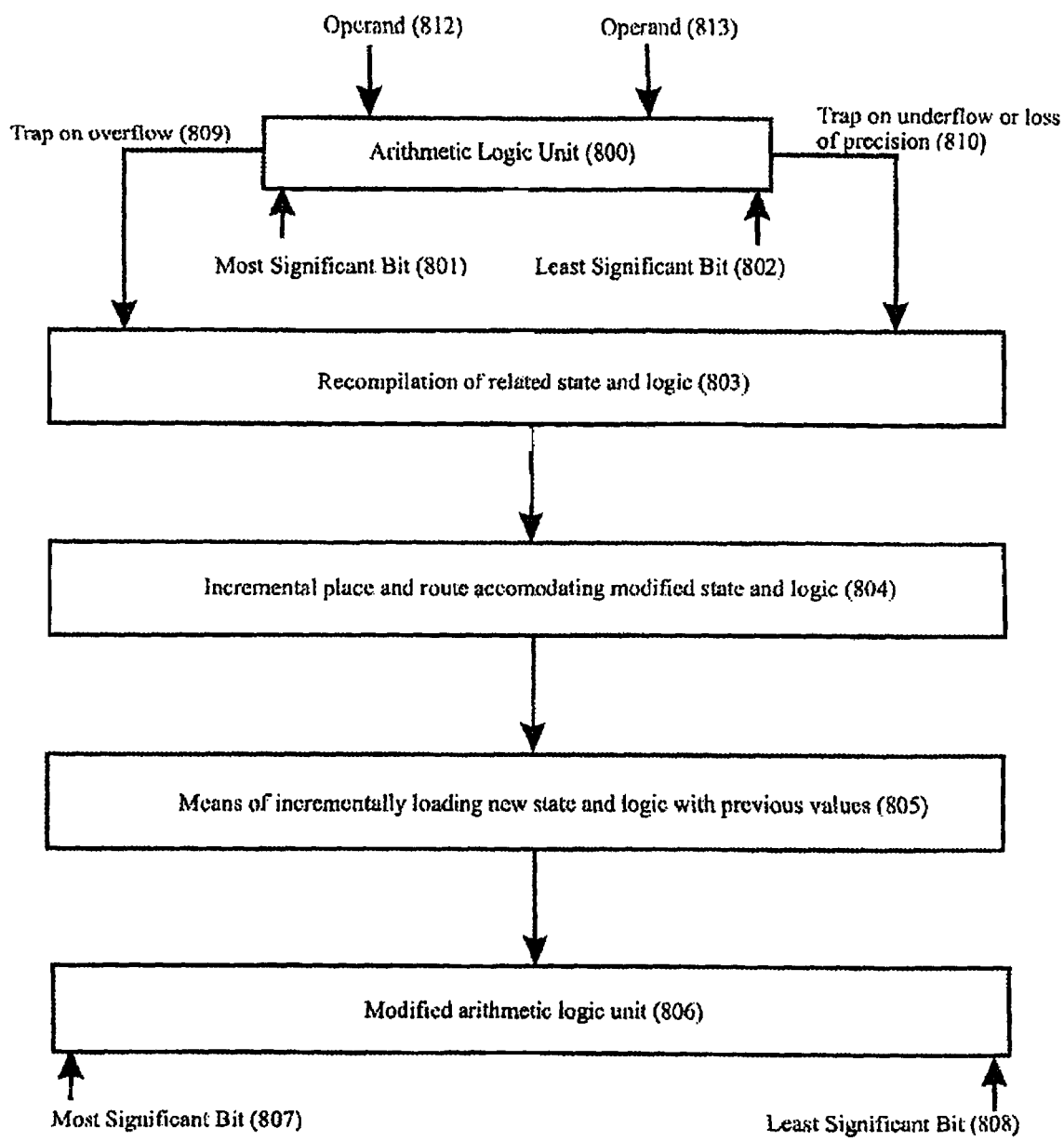
FIG. 18 illustrates efficiently extending arithmetic range and precision using incremental recompilation on underflow, overflow or loss of precision.

FIG. 18 shows an arithmetic logic unit which accepts input (812 and 813) which may result in an output which is too large to represent, too small to represent or which approximates the least significant bits of the result. For example, if the arithmetic logic unit, associated data paths and registers is designed to represent a domain of integers from 0 to 7, adding the values 7 and 7 would result in a number too large to represent (overflow), subtracting 7 from 0 would result in a number too small to represent (underflow), dividing 4 by 3 would result in a number which cannot accurately be represent (loss of precision).

In order to reduce the probability and impact of overflow, underflow or loss of precision, iterative numerical applications commonly employ a floating point representation consisting of a mantissa, implied base and exponent. Arithmetic operations involving such floating point representations are more complex to implement, are more likely to contain an implementation error, require additional gate delays to implement. Designing using a numerical representation with a larger domain reduces the probability of underflow, over-flow or loss of precision at the expense of addition gate complexity, power and size (all usually undesirable properties of a design).

With a suitable initial choice of a numeric representation, the probability of overflow, underflow or loss of precision can be made arbitrarily low, however external factors such as the number of iterations actually taken by an algorithm often remain beyond the designer's control. Therefore most arithmetic implementations provide some means for executing trap or exception software to handle such cases with a more complex (but slower) implementation. In the prior art, once a value is outside of the range efficiently supported by hardware, the software implementation (trap handler) continues to take longer to implement arithmetic operations. In time-critical applications such as a control loop, such delays may then lead to consequential failures.

The present invention takes advantage of the flexibility provided by electronically re-configurable logic (FPGA) together with the tight proximity of an Incremental Compiler (5) so as to respond to hardware detected underflow, overflow or loss of precision by a process consisting of reading the existing state related to the change, modification to the Elaborated Representation (4) so as to increase the domain range, shift the range or scale the range, Recompiling Related State and Logic (803 using 5), Incrementally Binding and Scheduling (451) the new functionality, Incrementally Re-synthesizing (460), Incrementally Scheduling (460), Incrementally Re-timing (460), Incrementally Placing and Routing (461), merging the previous state with the new logic configuration and incrementally re-loading the logic configuration and merged state. The computation then continues at full speed.

One may readily argue that the innovation is not useful since if resources were available initially on the FPGA to increase the domain, shift the range or scale the range it could be more efficiently and reliability be done during the initial design. This invention's utility lies in its ability to selectively expend FPGA resources based on actual usage rather arbitrarily resource usage, power and size based on the incomplete information available at design time (which may be years before the logic configuration is actually used).

As a further improvement of this invention, some functionality must be provided to effectively handle a Technology Binding and Schedule step (451) when no resources are efficiently available to implement a change in the Elaborated Representation (4). Periodic sampling of actual values, perhaps during the system's idle time, provides a general purpose processor with data on the most probable value ranges currently being encountered. Ranges and precision of logic may be immediately decreased in other areas to permit an incremental recompilation as long as the immediate values present at the time of recompilation can be fully and accurately represented. However if decreases in the range or precision of some logic immediately trigger a recompilation then the innovation may not be efficient. Therefore profile data on the range and precision of each value and arithmetic logic unit over time enables more efficient overall changes to the Elaborated Representation (4).

Particularly in the context of analog, mixed-signal and full-wave simulation using an FPGA, this innovation facilitates accurate and efficient use of an integer representation rather than requiring the size, latency and power requirements of a floating point representation within the FPGA. The resulting integer logic implementation can retain the same range as the floating point representation when required while achieving increased and uniform precision. Uniform precision across the entire domain of the representation increases numerical stability and accuracy of iterative numerical applications (such as simulation) since any precision errors introduced by eventual rounding are uniform across the domain. Fortunately with the present invention such rounding need not occur until FPGA resources are exhausted and then in a uniform and instantaneous fashion which further increases numerical accuracy.

Figure 19:
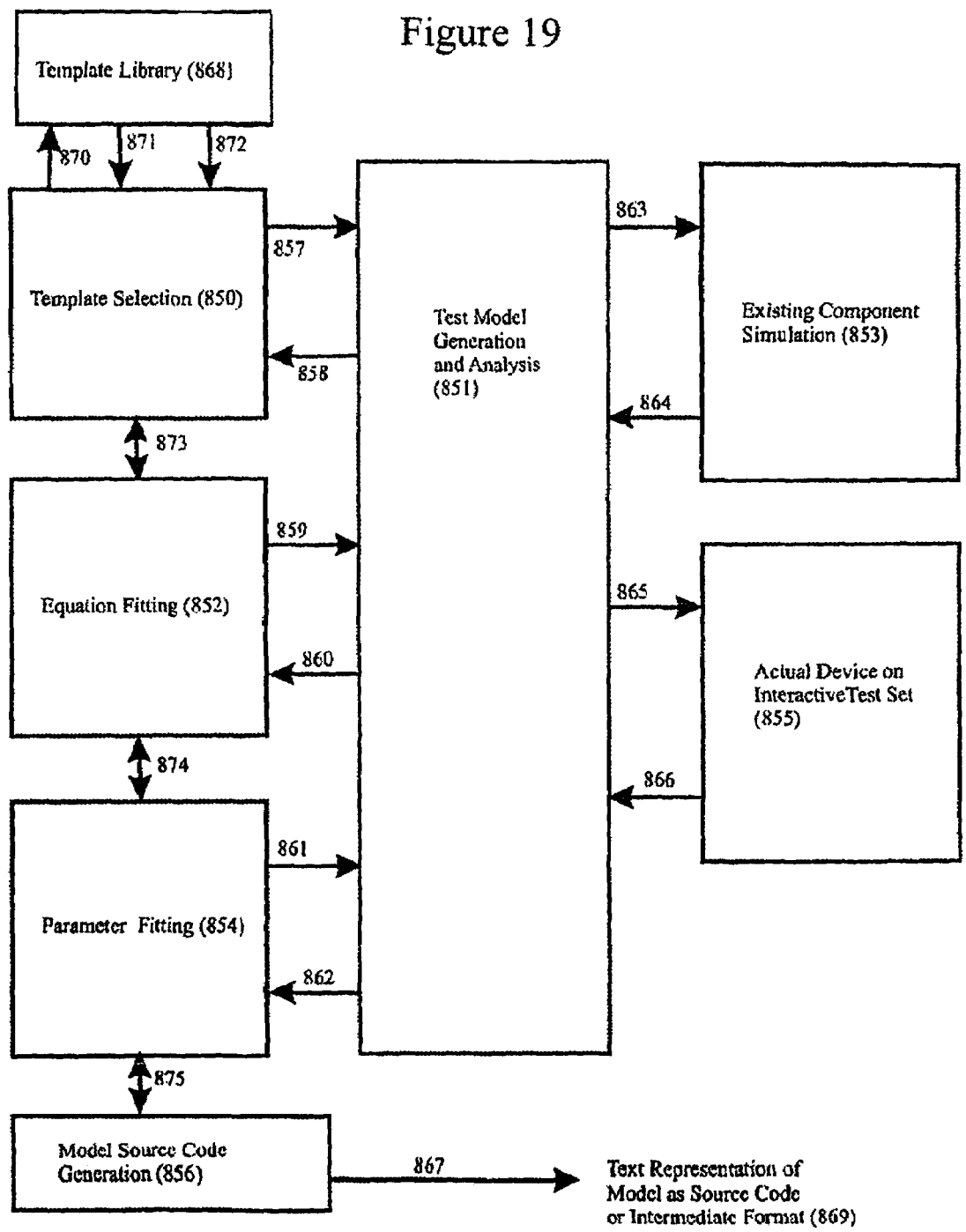
FIG. 19 illustrates the steps in the method for semi-automated extraction of model from behavioral simulation.

At a broader level, the ability to create either more detailed (synthesized) or more abstract (higher performance) of an existing model or actual, realized device are important to the ability to accurately simulate a design using the invention disclosed here. The same capabilities are useful in the realization process when there is a need to synthesize a realizable analog or mixed signal model from a behavioral design. FIG. 19 illustrates a method for semi-automatically generating more detailed or more abstract models given an existing, black-box analog or mixed signal component simulation (853) or equivalently an actual device present in a test system allowing external presentation of simulus and response sampling (855).

Figure 20:
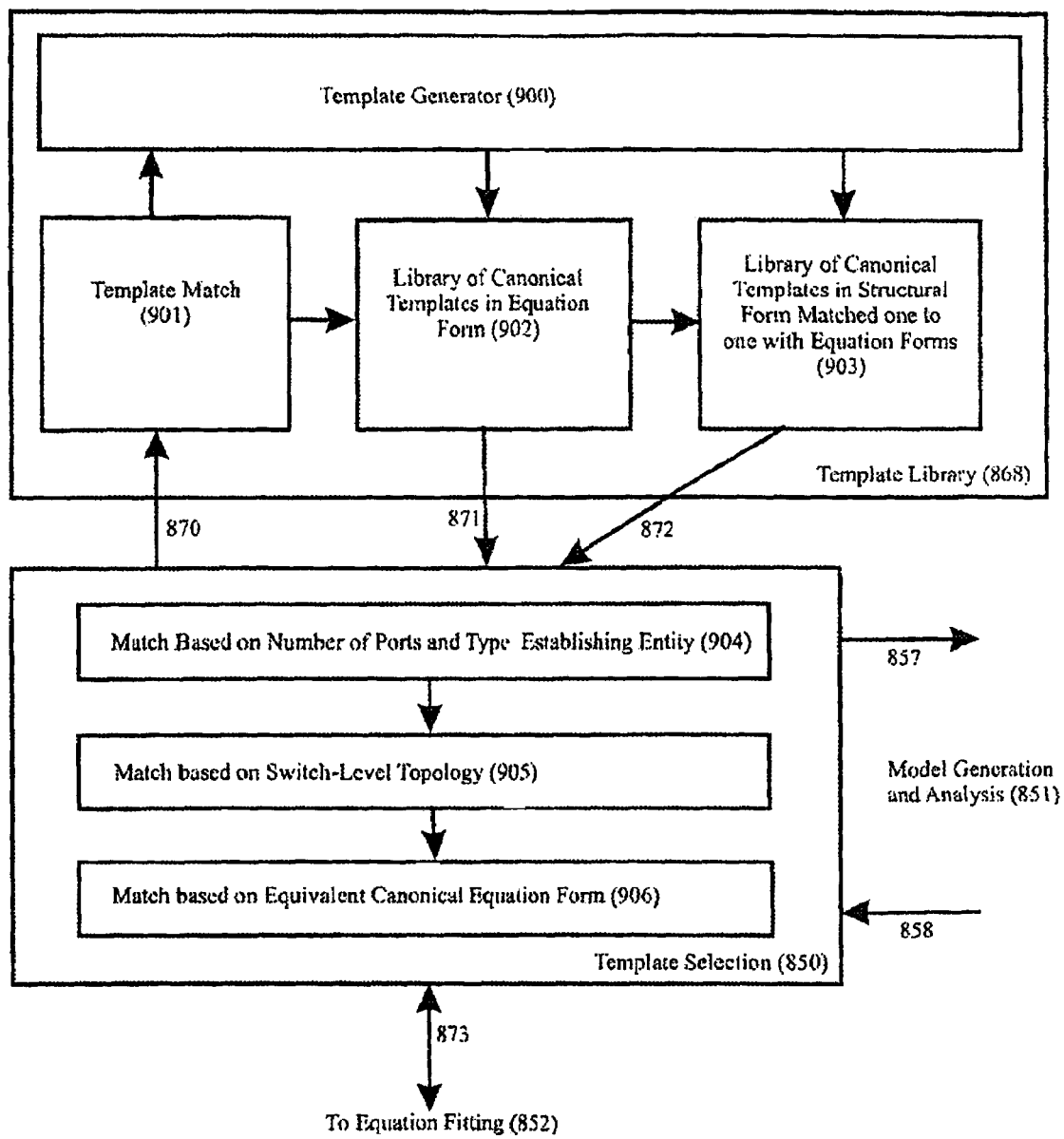
FIG. 20 illustrates the steps in the method of semi-automated extraction of model from actual device operation.

Model generation begins with an incrementally formed Template Library (868), detailed in FIG. 20. The template library iteratively translates a sequence of model specifications (870) either directly into a tem-plate match against an existing template in the library or indirectly via generation of a matching template via Template Generator (900). Each matching template consists of two views: one view as an equation system (perhaps with embedded conditionals and reference to digital interface objects) and the other view as a structural model in which the components are drawn from a small set of generally accepted terminal components. The preferred embodiment specifically uses the set of SPICE components augmented with BSIM models and RF/MW models such as transmission lines and specific antenna forms. The initial Template Library (868) must begin with a library of existing templates. In the preferred embodiment this library is read in from files and a directory hierarchy using FTL Systems' AIRE/CE File Intermediate Representation (FIR) however those skilled in the art will recognize that other intermediate representations may readily be adapted to the method.

The means of Template Selection (850) iterates between a refined specification of the required template (870) and iterative probing of the simulated (853) or actual (855) reference via the means of Test Model Generation and Analysis (851). Template selection evolves through three selection phases: a means of matching the template and reference based on the number and type of ports, establishing the VHDL-AMS entity to be generated (904), template matching based on switch-level topology (905) and matching based on equivalent canonical equation formulation (906). The preferred embodiment uses Verilog's predefined switch level models for convenience, however those skilled in the art will recognize that other switch level and equivalent representations may be adapted. Matching based on equivalent canonical form will be discussed below.

Following tentative selection of a template, equation specifics are fit to the model in the equation fitting step (852). Various techniques for experimentally fitting equations to data are well known, such as the excellent summary applied to non-linear and microwave devices by Turlington. Other comparable techniques are well known to those skilled in the art of numerical analysis. Finally the model formation concludes with parameter fitting, again using well-known techniques for fitting experimental data to a system of equations. Each refinement in the equation view drives an equivalent, incremental change to the structural view.

In FIGS. 19 and 20, Steps 850, 852 and 854 rely on a common module which provides a means of converting ambiguities in a system of equations into a self-contained test case (consisting of a test bench and stimuli), a means of submitting the test case to a simulated or actual device and a means of responding to 850, 852 and 854. For convenience interfaces 863 and 864 generate a well-known SPICE deck format and accept a table consisting of a value for each probed quantity at each time step. Other, equivalent formats are well known to those familiar with SPICE simulation. The test set interface (865 and 866) uses the same protocol as 863 and 864. An interactive test set (written in Perl with network extensions) converts the SPICE inter-face to a set of equivalent General Purpose Interface Bus (GPIB) commands. Other, equivalent interfaces are well known to those skilled in the art of test equipment instrumentation.

Test Model Generation and Analysis (851) uses a parameterized, in-memory representation for the preferred embodiment, such as FTL Systems' AIRE/CE Internal Intermediate Representation (IIR). Other, comparable representations are known to those skilled in the art of intermediate format design and implementation.

Finally, IIR may be converted into a textual format (867) using an IIR to source code printer. Such a module is included with FTL Systems' Tauri source code analyzer, however other and comparable mechanisms for printing an intermediate format as text are commonly included in hardware description language compilers.

Figure 22:
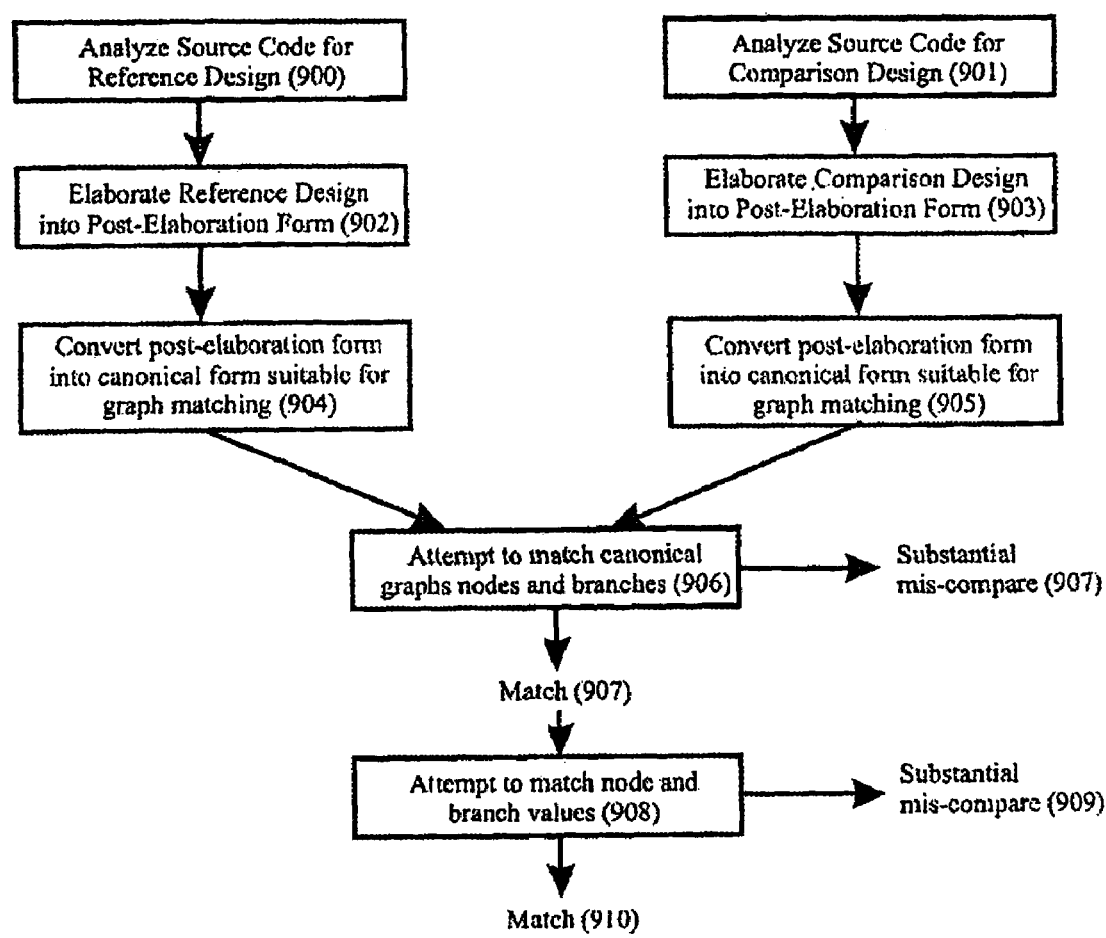
FIG. 22 illustrates the steps in the method for formal comparison of two mixed signal models.
Figure 23:
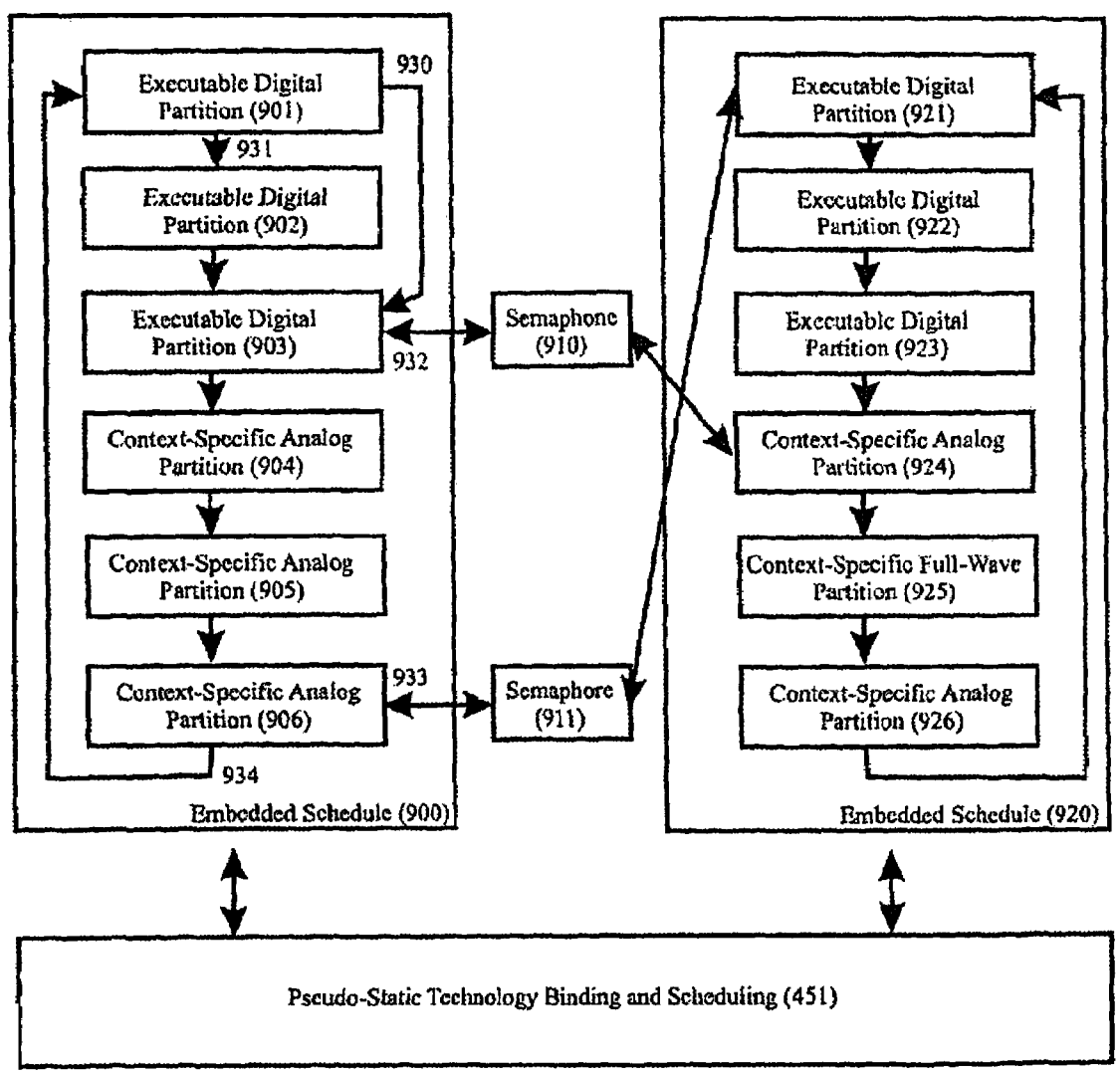
FIG. 23 illustrates the embedded scheduling of mixed signal designs for efficient simulation on multiple processors.

Both to implement Template Selection (850), Equation Fitting (852) and Parameter Fitting (854) as well as for purposes of manual design and optimization, it is useful to be able to compare two analog or mixed signal models without the need for simulation, as shown in FIG. 22. When incorporated in model generation, the reference and comparison models may immediately be supplied as step 902/903. When the models are first made available as source code, the source code must be analyzed (900/901) using 1, elaborated (902/903) using (3) and then converted into a canonical intermediate format, such as C. J. Shi's Determinant Decision Diagrams (DDD). Other canonical forms for equation systems are evident to those skilled in numerical array and graph algorithms.

Existing graph matching algorithms first match nodes and branches in the canonical representations (906), then compare attributes or values assigned to corresponding nodes or branches (908). If either graph matching fails to find a correspondence between the nodes and branches of the reference and comparison canonical forms, the match fails.

Figure 21:
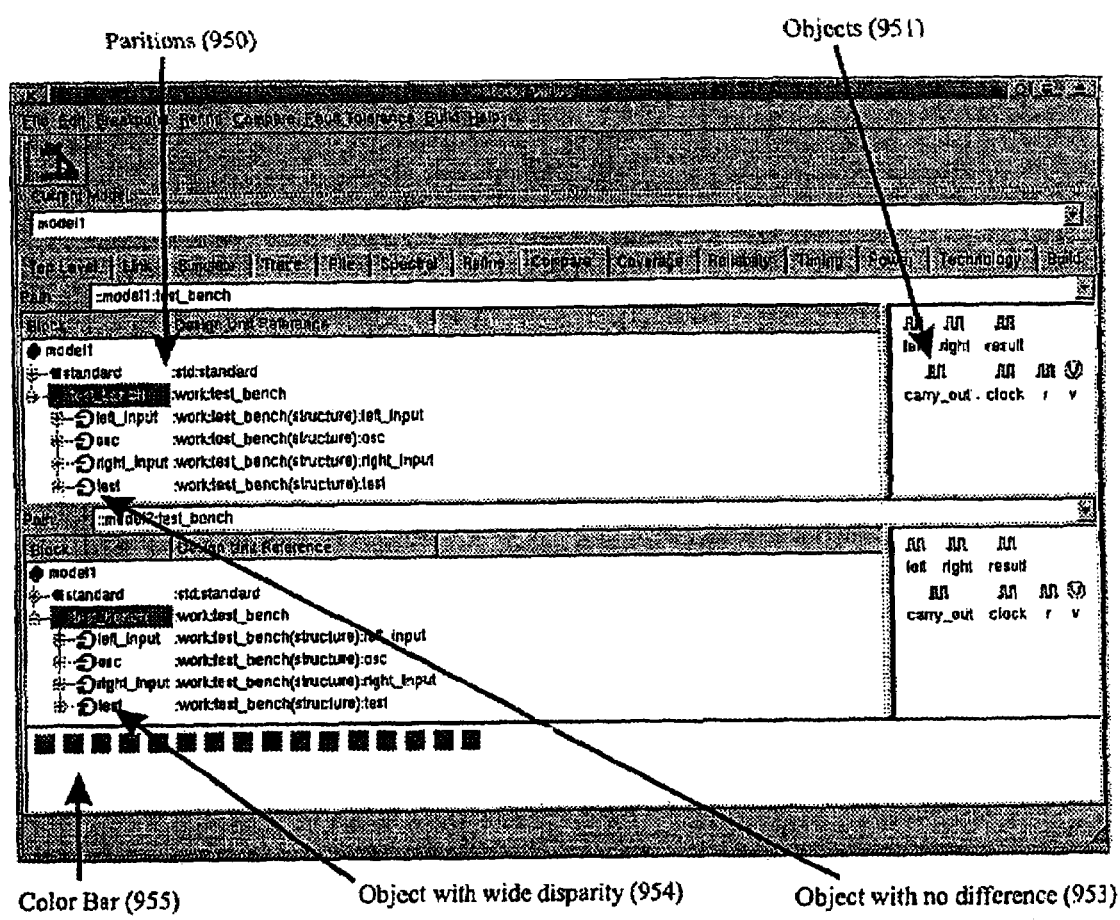
FIG. 21 illustrates an interactive representation of design comparison or model generation using graphical user interface.

If the attribute values of reference and comparison models are "close", it is useful for the designer to visually compare the two models, using the graphical user interfaces shown in FIG. 21. In this interface partitions (950) and objects (951) have been brought into a one to one correspondence, then represented with an icon. Each icon is divided into segments with a distinct color assigned to each segment (952). The color represents the comparative aggregate value (average over space and time) of each attribute. When the two halves are of the same color, there is no aggregate difference (953). Conversely a wide disparity in color visually calls attention to the difference (954). A color bar associated with the user interface allows the designer to manually force the attribute-value (955). The designer may then initiate re-computation of the comparison in order to manually perform a sensitivity analysis.

Those skilled in the art will further appreciate that the present invention may be embodied in other specific forms without departing from the spirit or central attributes thereof. In that the foregoing description of the present invention discloses only exemplary embodiments thereof, it is to be understood that other variations are contemplated as being within the scope of the present invention. Accordingly, the present invention is not limited in the particular embodiments which have been described in detail therein. Rather, reference should be made to the appended claims as indicative of the scope and content of the present invention.

What is claimed is:

1. Instructions stored on a computer-readable medium for directing operation of a computer to semi-automatically create a behavioral representation of an electronic, mechanical or electra-mechanical circuit which can be manifest as text, the behavioral representation denoting mathematical or structural relationships between inputs, initial state and outputs of said circuit for purposes such as system-level modeling, formal verification and synthesis of alternative hardware implementations, wherein apparatus attached to the computer applies and measures physical quantities at a plurality of ports of an attached hardware device includes the ability to impose and measure physical quantities imposed on or generated by operations of said hardware device, the instructions further causing the computer to:
   (1) imposing physical quantities to the plurality of ports of the attached hardware device;
   (2) measuring physical quantities resulting from operation of the hardware device at the plurality of ports of the hardware device,
   (3) generating a best fit for the measured physical quantities to a plurality of candidate templates having parametric terms;
   (4) selecting among one or more templates by software defined comparisons which best fit the observed behavior of the hardware device to the parameterized templates and corresponding template values;
   (5) comparing the predicted behavior of each template together with parameters determined in steps (1), (2), (3), and (4), via methods such as simulation or formal verification with the physical quantities observed;

(6) changing at least one of the parametric terms if the predicted physical quantities in step (5) differ from the measured physical quantities resulting from step (2); and (7) repeating steps (2) (3) (4) (5) and (6) until the predicted physical quantities are within predetermined tolerances from the measured physical quantities, for finishing the semi-automatically created behavioral representation equivalent to a textual representation of the hardware device in a structural or behavioral hardware description language.

2. The instructions of claim 1, further comprising the step of generating a graphical representation of an operating space, wherein a first axis of the graphical representation is associated to a state variable value of one of the plurality of ports of the device under test, and wherein colors in each region of the graphical representation is associated to a degree of correspondence between the behavior of the hardware embodiment of the device as measured and the behavior resulting from simulation of the semi-automatically created device model.

3. The instructions of claim 1 wherein the physical quantities are selected from the group comprising voltage, current, force, velocity, acceleration, pressure or temperature.

4. The instructions of claim 1 wherein the tolerances are implied or explicit in the modeling language or characteristics specified by the human operator.

5. The instructions of claim 1 further causing the computer to output a textual representation of the behavioral representation.

6. A method, using a computer, to semi-automatically create a behavioral representation of a electronic, mechanical or electro-mechanical circuit which can manifest itself as text, the behavioral representation denoting mathematical or structural relationships between inputs, initial state and outputs of said circuit for purposes such as system-level modeling, formal verification and synthesis of alternative hardware implementations, wherein the computer applies and measures physical quantities for a plurality of ports of a pre-existing circuit embodied as an existing software simulation, the computer including the ability to impose and measure physical quantities imposed on or generated by operations of said pre-existing circuit embodied as an existing software simulation, the method comprising:

(1) imposing physical quantities to the plurality of ports of the attached hardware device;

(2) measuring physical quantities resulting from operation of the pre-existing circuit embodied as an existing software simulation at the plurality of ports of the the pre-existing circuit embodied as an existing software simulation;

(3) generating a best fit for the measured physical quantities to a plurality of candidate templates having parametric terms;

(4) selecting among one or more templates by software defined comparisons which best fit the observed behavior of the pre-existing circuit embodied as an existing software simulation to the parameterized templates and corresponding template values;

(5) comparing the predicted behavior of each template together with parameters determined in steps (1), (2), (3) and (4), via methods such as simulation or formal verification with the physical quantities observed in (2);

(6) changing at least one of the parametric terms if the predicted physical quantities in step (5) differ from the measured physical quantities resulting from step (2); and (7) repeating steps (2) (3) (4) (5) and (6) until the predicted physical quantities are within predetermined tolerances from the measured physical quantities, for finishing a semi-automatically created behavioral representation equivalent to a textual representation of the pre-existing circuit embodied as an existing software simulation in a structural or behavioral hardware description language.

7. The method of claim 6, further comprising the step of generating a graphical representation of an operating space, wherein a first axis of the graphical representation is associated to a state variable value of one of the plurality of ports of the simulated device under test, and wherein colors in each region of the graphical representation is associated to a degree of correspondence between the pre-existing device model as embodied in the pre-existing simulator and the semi-automatically created device model.

8. The method of claim 6 wherein the physical quantities are selected from the group comprising voltage, current, force, velocity, acceleration, pressure or temperature.

9. The instructions of claim 6 wherein the tolerances are implied or explicit in the modeling language or characteristics specified by the human operator.

10. The instructions of claim 6 further causing the computer to output a textual representation of the behavioral representation.

* * * * *

UNITED STATES PATENT AND TRADEMARK OFFICE
CERTIFICATE OF CORRECTION

| | | |
|---|---|---|
| PATENT NO. | : 7,328,195 B2 | Page 1 of 1 |
| APPLICATION NO. | : 10/301173 | |
| DATED | : February 5, 2008 | |
| INVENTOR(S) | : John Christopher Willis | |

It is certified that error appears in the above-identified patent and that said Letters Patent is hereby corrected as shown below:

Title Page

Item (54) and col. 1, line 2,

After "MODELS" insert --WITH--.

Claim 1

Column 28, line 43, delete "electra" and insert --electro--.

Signed and Sealed this

Twenty-sixth Day of August, 2008

JON W. DUDAS
*Director of the United States Patent and Trademark Office*